(12) United States Patent  
Hasegawa et al.

(10) Patent No.: US 7,738,076 B2  
(45) Date of Patent: Jun. 15, 2010

(54) EXPOSURE APPARATUS AND DEVICE MANUFACTURING METHOD

(75) Inventors: Noriyasu Hasegawa, Tochigi (JP); Shigeru Terashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 342 days.

(21) Appl. No.: 11/495,767

(22) Filed: Jul. 31, 2006

(65) Prior Publication Data

US 2006/0274292 A1 Dec. 7, 2006

Related U.S. Application Data

(62) Division of application No. 11/136,687, filed on May 25, 2005, now Pat. No. 7,123,343, which is a division of application No. 10/329,816, filed on Dec. 27, 2002, now Pat. No. 6,934,003.

(30) Foreign Application Priority Data

Jan. 7, 2002 (JP) .............................. 2002-000689  
Feb. 8, 2002 (JP) .............................. 2002-032274  
Dec. 26, 2002 (JP) .............................. 2002-377086

(51) Int. Cl.  
*G03B 27/52* (2006.01)

(52) U.S. Cl. .......................................... 355/30; 355/53

(58) Field of Classification Search .................. 355/30, 355/53; 359/509  
See application file for complete search history.

(56) References Cited

U.S. PATENT DOCUMENTS 4,801,352 A * 1/1989 Piwczyk .................. 156/345.5

(Continued)

FOREIGN PATENT DOCUMENTS

EP 0 957 402 A2 11/1999

(Continued)

OTHER PUBLICATIONS

Japanese Office Action dated Aug. 17, 2004, issued in corresponding Japanese patent application No. 2002-377086, with English translation.

(Continued)

*Primary Examiner*—Hung Henry Nguyen  
*Assistant Examiner*—Steven H Whitesell-Gordon  
(74) *Attorney, Agent, or Firm*—Fitzpatrick, Cella, Harper & Scinto

(57) ABSTRACT

An exposure apparatus for exposing a substrate to exposure light via a pattern of a mask. The apparatus includes a stage configured to hold one of the substrate and the mask, and to move, a projection optical system configured to project the pattern onto the substrate, a defining member facing the stage and configured to define a space, between the stage and the projection optical system, through which the exposure light passes and which is to be filled with fluid, a first stream mechanism having a first supply port in the defining member and configured to stream the fluid through the space from the first supply port, an exhaust mechanism having an exhaust port in the defining member and configured to exhaust fluid in the space from the exhaust port, and a second stream mechanism having a second supply port different from the first supply port. The second supply port is arranged to surround the space at a lower portion of the defining member, and configured to stream fluid from the second supply port against the stage to seal the space.

5 Claims, 34 Drawing Sheets

U.S. PATENT DOCUMENTS

| | | | |
|---|---|---|---|
| 4,998,821 A | 3/1991 | Ohta et al. | 353/122 |
| 5,063,582 A | 11/1991 | Mori et al. | 378/34 |
| 5,093,579 A | 3/1992 | Amemiya et al. | 250/453.1 |
| 5,138,643 A | 8/1992 | Sakamoto et al. | 378/34 |
| 5,157,700 A | 10/1992 | Kurosawa et al. | 378/34 |
| 5,231,291 A | 7/1993 | Amemiya et al. | 250/443.1 |
| 5,559,584 A | 9/1996 | Miyaji et al. | 355/73 |
| 5,898,477 A | 4/1999 | Yoshimura et al. | 355/53 |
| 5,997,963 A | 12/1999 | Davison et al. | 427/582 |
| 6,317,479 B1 | 11/2001 | Chiba et al. | 378/35 |
| 6,463,119 B1 | 10/2002 | Terashima et al. | 378/34 |
| 6,542,220 B1 | 4/2003 | Schrijver et al. | 355/53 |
| 6,555,834 B1 | 4/2003 | Loopstra | 250/492.3 |
| 6,665,046 B2 | 12/2003 | Nogawa et al. | 355/30 |
| 6,933,513 B2 | 8/2005 | Van Empel et al. | 250/492.3 |
| 6,987,278 B2 | 1/2006 | Loopstra | 250/492.3 |
| 2001/0055326 A1 | 12/2001 | Miwa et al. | 372/57 |
| 2002/0002946 A1 | 1/2002 | Tanaka et al. | 118/719 |
| 2002/0018190 A1 | 2/2002 | Nogawa et al. | 355/30 |
| 2002/0112784 A1 | 8/2002 | Tanaka et al. | 148/213 |
| 2002/0191163 A1 | 12/2002 | Hasegawa et al. | 355/30 |
| 2002/0191166 A1 | 12/2002 | Hasegawa et al. | 355/53 |
| 2003/0006380 A1 | 1/2003 | Van Empel et al. | 250/492.3 |
| 2003/0146396 A1 | 8/2003 | Loopstra | 250/492.2 |

FOREIGN PATENT DOCUMENTS

| | | |
|---|---|---|
| EP | 1 020 897 A1 | 7/2000 |
| EP | 1 098 225 A2 | 5/2001 |
| EP | 1 098 226 A2 | 5/2001 |
| EP | 1 229 573 A1 | 8/2002 |
| JP | 54-69404 | 6/1979 |
| JP | 6-260385 | 9/1994 |
| JP | 10-214782 | 8/1998 |
| JP | 11-111586 | 4/1999 |
| JP | 2000-200745 | 7/2000 |
| JP | 2001-118783 | 4/2001 |
| JP | 2001-168027 | 6/2001 |
| JP | 2001-210587 | 8/2001 |
| JP | 2001-250759 | 9/2001 |
| JP | 2001-284224 | 10/2001 |
| JP | 2001-297972 | 10/2001 |
| JP | 2001-358056 | 12/2001 |
| WO | WO 01/06548 A1 | 1/2001 |
| WO | WO 01/84241 A1 | 11/2001 |

OTHER PUBLICATIONS

Japanese Office Action dated Jul. 19, 2005, issued in corresponding Japanese patent application No. 2003-377086, with English translation.

European Search Report dated Aug. 19, 2004, issued in European patent application No. 03 25 0001, forwarded in a Communicated dated Aug. 30, 2004.

* cited by examiner

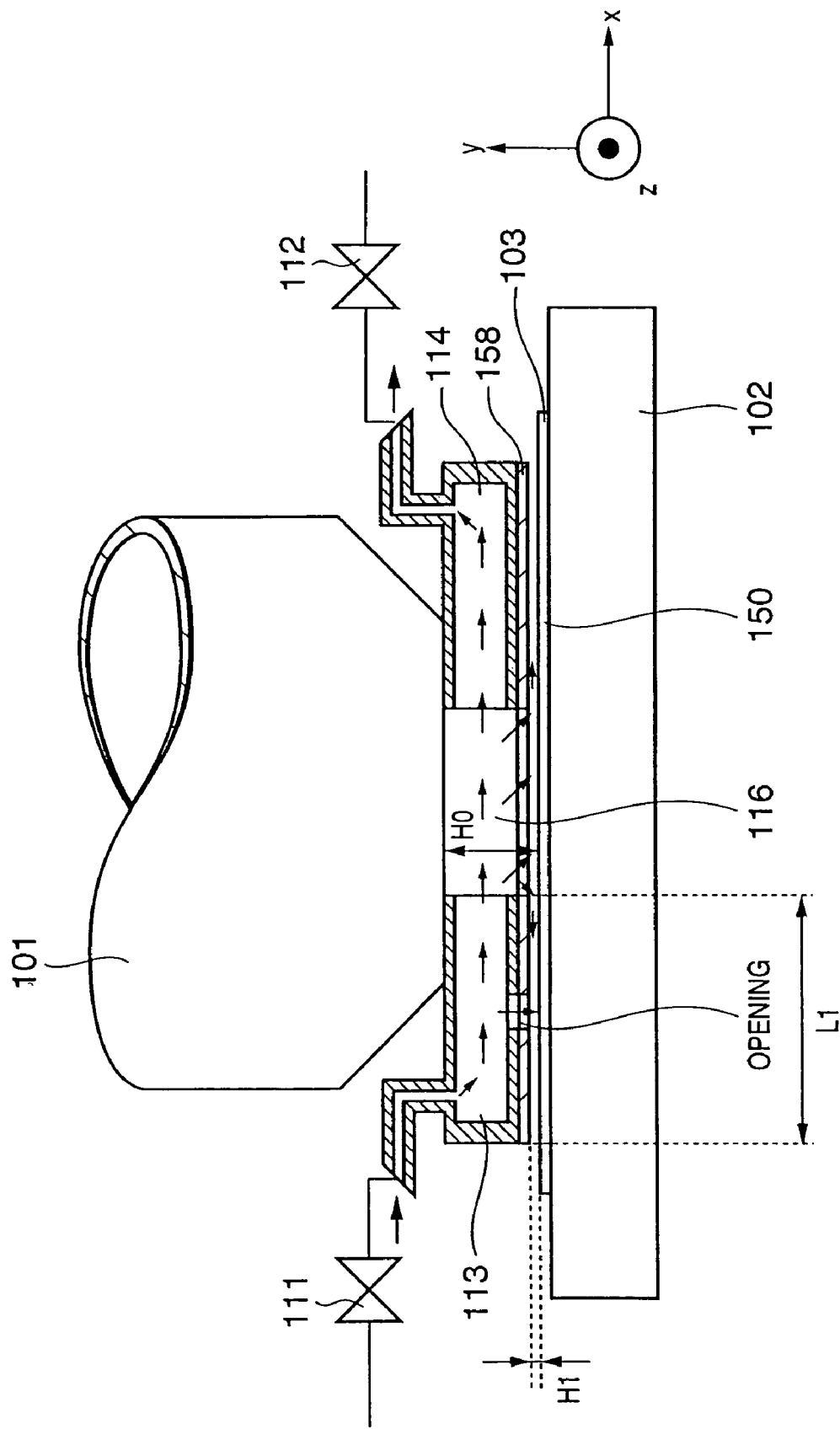

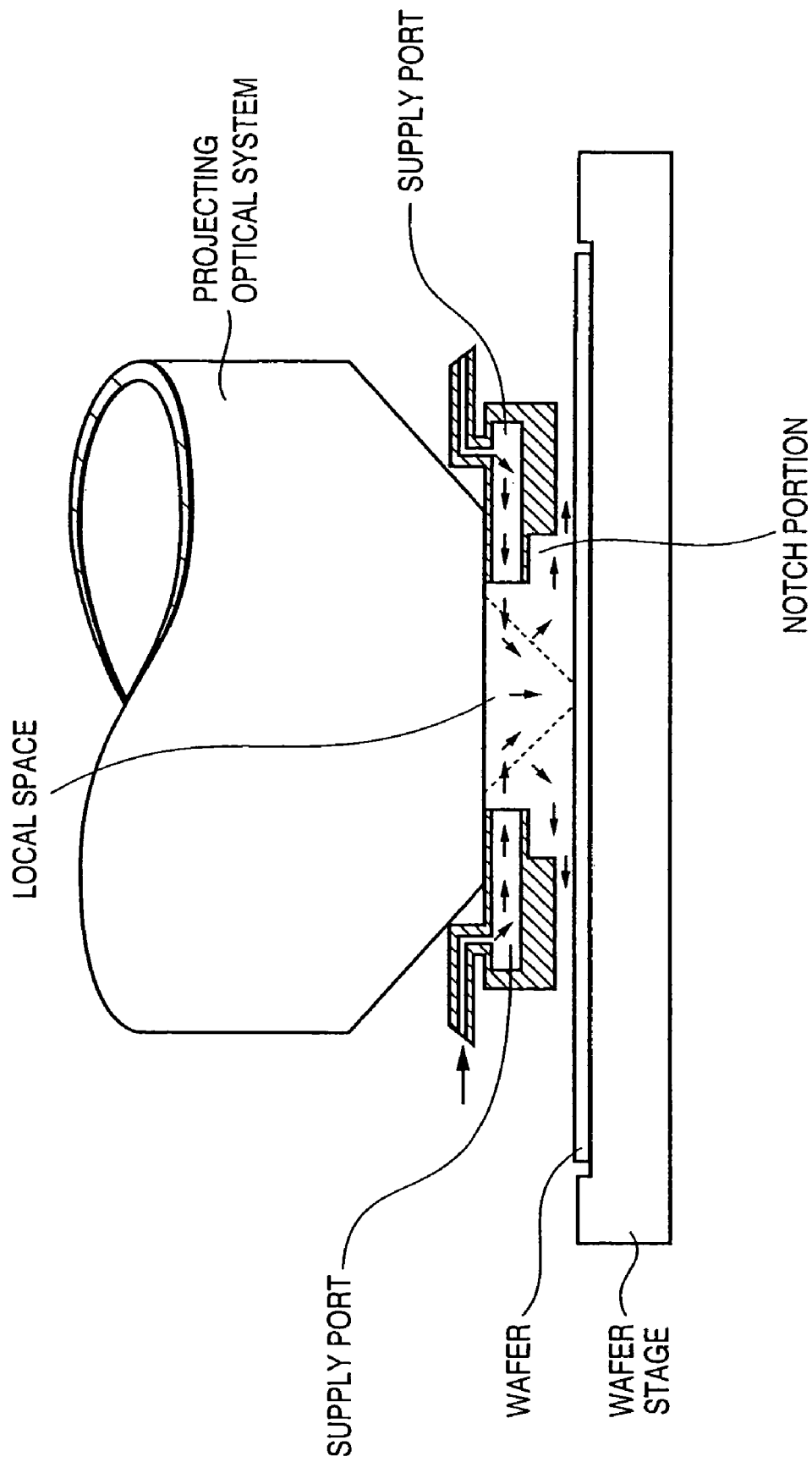

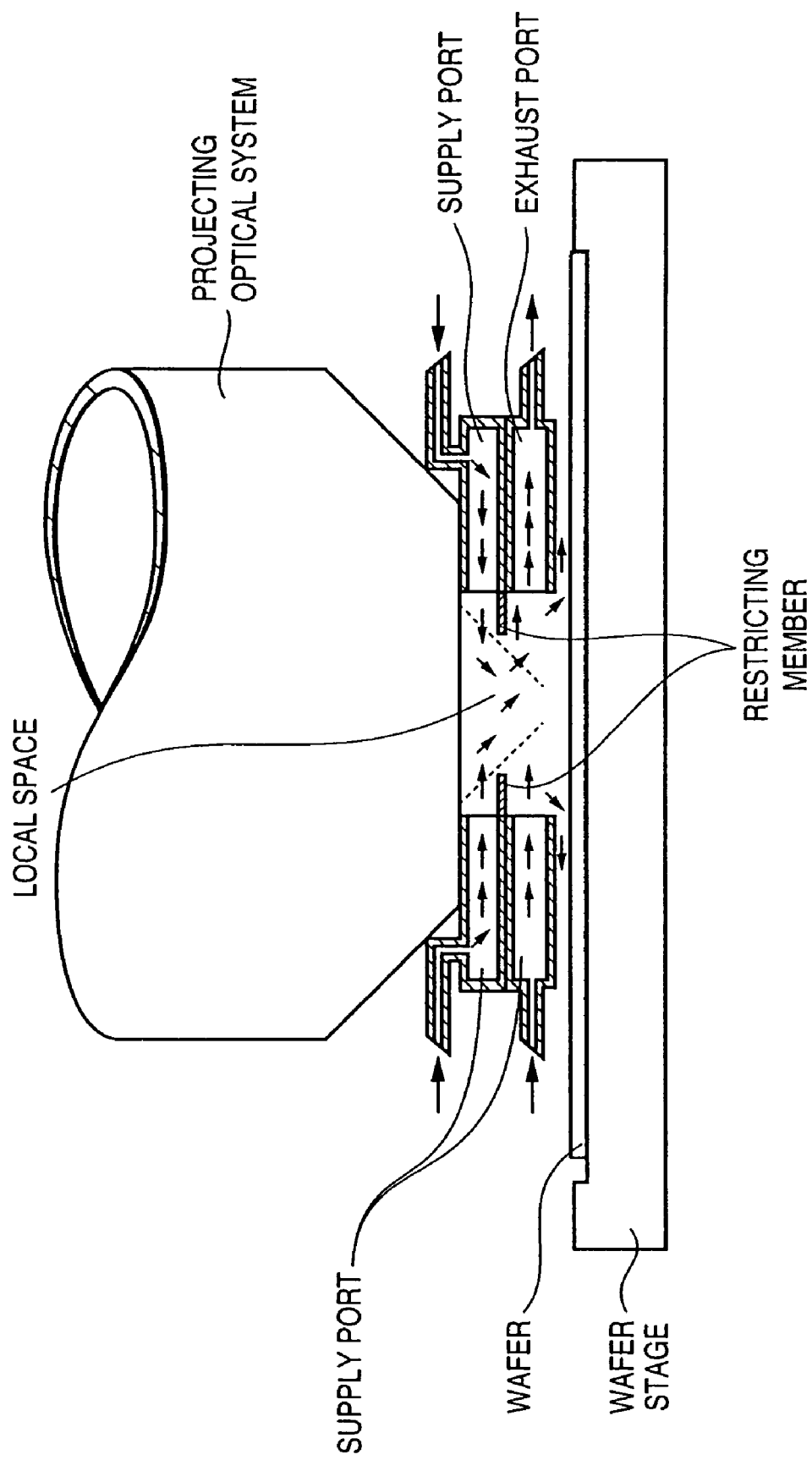

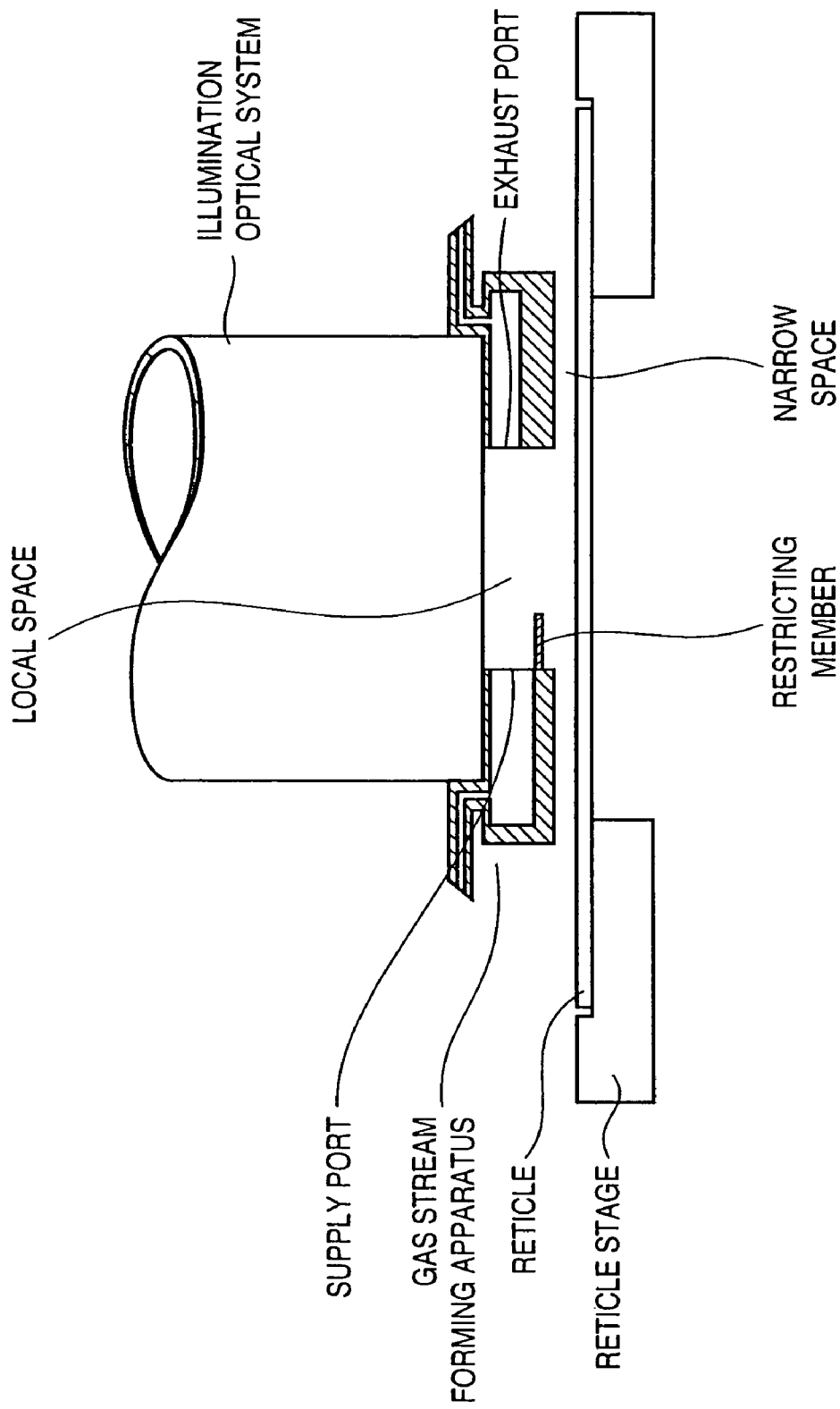

EXPOSURE APPARATUS AND DEVICE MANUFACTURING METHOD

This application is a divisional application of copending U.S. patent application Ser. No. 11/136,687, filed May 25, 2005, which is a divisional of U.S. patent application Ser. No. 10/329,816, filed on Dec. 27, 2002, which issued as U.S. Pat. No. 6,934,003 on Aug. 23, 2005.

FIELD OF THE INVENTION

The present invention relates to an exposure apparatus which projects and transfers a pattern formed on a mask to a substrate using exposure light, and a device manufacturing method.

BACKGROUND OF THE INVENTION

In photolithography for manufacturing a semiconductor element, or the like, an exposure apparatus which projects and exposes a pattern image on a mask (e.g., a reticle) to a photosensitive substrate through a projecting optical system is used. Semiconductor integrated circuits developed recently are aiming at micropatterning. In photolithography, photolithography light sources are going to have shorter wavelengths.

However, when vacuum UV light and, more particularly, light having a wavelength shorter than 250 nm, e.g., harmonic light of a KrF excimer laser (wavelength: 248 nm), an ArF excimer laser (wavelength: 193 nm), $F_2$ laser (wavelength: 157 nm), or a YAG laser is used as exposure light, the intensity of exposure light decreases due to the influence of exposure light absorption by oxygen, and the like.

To avoid the decrease in exposure light transmittance, a conventional exposure apparatus having a light source such as an $F_2$ excimer laser forms a sealed space where only an optical path portion is sealed and replaces the gas in the sealed space with a gas such as nitrogen containing no oxygen.

FIGS. 14A and 14B are views showing an exposure apparatus which performs exposure by supplying an inert gas to a space between a photosensitive substrate (wafer) and the final optical member of a projecting optical system (lens barrel) to form an inert gas atmosphere in the space. In this exposure apparatus, to separate the space on the exposure region from the ambient atmosphere, a shielding member is arranged around the space, and the inert gas is supplied from the periphery of the exposure region into the space.

In the exposure apparatus shown in FIGS. 14A and 14B, however, the atmosphere in the space cannot be replaced with the inert gas until the atmosphere at the step or gap around the wafer moves into the space. In exposing the periphery of the wafer, the inert gas concentration in the space decreases. In addition, when the wafer stage moves at a high speed, the inert gas concentration decreases due to the influence of involvement, resulting in a variation in illuminance.

A similar problem is posed when an inert gas is supplied to the periphery of a reticle. In exposing the periphery of the reticle, the inert gas concentration in the space decreases. In addition, when the wafer stage moves at a high speed, the inert gas concentration decreases due to the influence of involvement, resulting in a variation in illuminance.

SUMMARY OF THE INVENTION

The present invention has been made in consideration of the above problems, and has as its object to provide an exposure apparatus which can stabilize the inert gas concentration in a container that accommodates various members including an illumination system, a projecting lens system, and mechanical members, and a device manufacturing method.

According to the present invention, the foregoing object is attained by providing an exposure apparatus which projects and transfers a pattern formed on a mask to a substrate using exposure light, comprising:

a stage;

an optical system;

a gas stream forming mechanism which forms a stream of an inert gas in an optical path space including a space which is located between the stage and the optical system and through which the exposure light passes; and a member which is arranged between the stage and a portion around the gas stream forming mechanism to form a predetermined space that maintains an average inert gas concentration P satisfying

P2<P<P1 where P1 is an average concentration of the inert gas present in the optical path space, and P2 is an average concentration of the inert gas present outside the optical path space.

According to the present invention, the foregoing object is attained by providing an exposure apparatus which projects and transfers a pattern formed on a mask to a substrate using exposure light, comprising:

a stage;

an optical system;

a gas stream forming mechanism which forms a stream of an inert gas in an optical path space including a space which is located between the stage and the optical system and through which the exposure light passes; and a member which forms a predetermined space between the optical path space and a peripheral space outside the optical path space in the exposure apparatus, wherein a width of the member in a direction of the stream of the inert gas is not less than twice a distance between the member and the stage.

In a preferred embodiment, the member is formed around the optical path space.

In a preferred embodiment, the member has at least one of a groove arranged outside the optical path space to surround the optical path space.

In a preferred embodiment, the width of the member in the direction of the stream of the inert gas is not less than three times the distance between the member and the stage.

In a preferred embodiment, the member is arranged upstream of the gas stream with respect to the optical path space.

In a preferred embodiment,
the apparatus performs exposure while scanning the mask and the substrate, and
the member is arranged in a direction of scanning with respect to the optical path space.

In a preferred embodiment, the member has a concave portion at a portion against the stage on an upstream side of the gas stream in the optical path space.

In a preferred embodiment, the apparatus further comprises a supply port which supplies an inert gas to the predetermined space, wherein the supply port is arranged on an upstream side of the gas stream in the optical path space.

In a preferred embodiment, the member is formed around the optical path space.

In a preferred embodiment, the member has at least one of a groove arranged outside the optical path space to surround the optical path space.

According to the present invention, the foregoing object is attained by providing an exposure apparatus which projects and transfers a pattern formed on a mask to a substrate using exposure light, comprising:

a stage;

an optical system;

a gas stream forming mechanism which forms a stream of an inert gas in an optical path space including a space which is located between the stage and the optical system and through which the exposure light passes; and a member which forms a predetermined space between the optical path space and a peripheral space outside the optical path space in the exposure apparatus, wherein a distance between the member and the stage is shorter than that between the stage and an optical element of the optical system, which is closest to the stage.

In a preferred embodiment, the distance between the member and the stage is not more than one-half that between the stage and the optical element of the optical system, which is closest to the stage.

In a preferred embodiment, the distance between the member and the stage is not more than one-quarter that between the stage and the optical element of the optical system, which is closest to the stage.

In a preferred embodiment, the member is arranged upstream of the gas stream with respect to the optical path space.

In a preferred embodiment, the apparatus performs exposure while scanning the mask and the substrate, and the member is arranged in a direction of scanning with respect to the optical path space.

In a preferred embodiment, the member has a concave portion at a portion against the stage on an upstream side of the gas stream in the optical path space.

In a preferred embodiment, the apparatus further comprises a supply port which supplies an inert gas to the predetermined space, wherein the supply port is arranged on an upstream side of the gas stream in the optical path space.

In a preferred embodiment, the member is formed around the optical path space.

In a preferred embodiment, the member has at least one of a groove arranged outside the optical path space to surround the optical path space.

According to the present invention, the foregoing object is attained by providing an exposure apparatus which projects and transfers a pattern formed on a mask to a substrate using exposure light, comprising:

a stage;

an optical system;

a gas stream forming mechanism which forms a stream of an inert gas in an optical path space including a space which is located between the stage and the optical system and through which the exposure light passes;

a member which forms a predetermined space between the optical path space and a peripheral space outside the optical path space in the exposure apparatus; and a gas supply mechanism which supplies the inert gas into the predetermined space.

In a preferred embodiment, the gas supply mechanism is branched from the gas stream forming mechanism.

In a preferred embodiment, a position at which the gas supply mechanism supplies the inert gas into the predetermined space is located upstream of the gas stream in the predetermined space with respect to the optical path space.

In a preferred embodiment, the apparatus performs exposure while scanning the mask and the substrate, and the member is arranged in a direction of scanning with respect to the optical path space.

In a preferred embodiment, the member has a concave portion at a portion against the stage on an upstream side of the gas stream in the optical path space.

In a preferred embodiment, the apparatus further comprises a supply port which supplies an inert gas to the predetermined space, wherein the supply port is arranged on an upstream side of the gas stream in the optical path space.

In a preferred embodiment, the member is arranged upstream of the gas stream with respect to the optical path space.

In a preferred embodiment, the member is formed around the optical path space.

In a preferred embodiment, the member has at least one of a groove arranged outside the optical path space to surround the optical path space.

According to the present invention, the foregoing object is attained by providing an exposure apparatus which projects and transfers a pattern formed on a mask to a substrate using exposure light, comprising:

a stage;

an optical system;

a gas stream forming mechanism which supplies an inert gas into an optical path space including a space which is located between the stage and the optical system and through which the exposure light passes; and a member which forms a predetermined space between the optical path space and a peripheral space outside the optical path space in the exposure apparatus, wherein the member forms, in the predetermined space, at least one groove having a width in a direction of a stream of the inert gas.

In a preferred embodiment, the apparatus further comprises a gas supply mechanism which supplies the inert gas from the at least one groove.

In a preferred embodiment, the member has a plurality of partitioning members arranged to surround the optical path space.

The distance from the lower end of the partitioning members to the substrate is preferably substantially equal to the distance from the lower end of the shielding member of the gas stream forming mechanism to the substrate.

The lower surface of the member preferably has at least one groove along the outer periphery of the optical path space.

The groove preferably becomes deeper as it is separated from the center of the gas stream forming mechanism.

The supply port and exhaust port of the gas stream forming mechanism and their channel are preferably formed in the member.

The member preferably has inside an opening which extends from the gas channel to the groove.

Part of the shielding member preferably has an opening.

The exhaust amount of the gas in the gas stream forming mechanism is preferably smaller than the supply amount of the gas.

The apparatus preferably further comprises an exhaust unit which exhausts the inert gas that leaks from the gas stream forming mechanism through the predetermined space together with the ambient atmosphere.

The inert gas can be nitrogen gas or helium gas.

The gas stream forming mechanism is preferably arranged to form the stream of the inert gas in the optical path space between the projecting optical system and the substrate. The member is preferably arranged to form the predetermined space between the stage and a portion around the gas stream forming mechanism.

The gas stream forming mechanism is preferably arranged to form the stream of the inert gas in the optical path space between an illumination optical system which illuminates the mask and a mask stage which holds the mask. The member is preferably arranged to form the predetermined space between the stage and a portion around the gas stream forming mechanism.

The gas stream forming mechanism is preferably arranged to form the stream of the inert gas in the optical path space between the projecting optical system and a mask stage which holds the mask. The member is preferably arranged to form the predetermined space between the stage and a portion around the gas stream forming mechanism.

The gas stream forming mechanism may have a first gas stream forming mechanism which is arranged to form the stream of the inert gas in a first optical path space between the projecting optical system and the substrate, a second gas stream forming mechanism which is arranged to form the stream of the inert gas in a second optical path space between the illumination system which illuminates the mask and the mask stage which holds the mask, and a third gas stream forming mechanism which is arranged to form the stream of the inert gas in a third optical path space between the mask stage and the projecting optical system. The member may be arranged to form the predetermined space between the stage and portions around the first to third gas stream forming mechanisms.

The supply port and exhaust port of the gas stream forming mechanism and their channel may be formed in the member.

The inert gas may be supplied from the member to the substrate. Supply of the inert gas from the member to the substrate and supply of the inert gas into the optical path space are preferably independently or commonly performed. The lower portion of the member preferably has at least one groove.

An exposure apparatus which projects and transfers a pattern formed on a mask to a substrate using exposure light preferably comprises:
 a stage;
 an optical system;
 a gas stream forming mechanism which supplies an inert gas into an optical path space including a space between the stage and the optical system where the exposure light passes through,
 wherein the gas stream forming mechanism comprises a restricting member in the optical path space in a direction from the optical system to the substrate.

The gas stream forming mechanism may have two opposing supply ports at a position close to the optical system in the optical path space, and a supply port and an exhaust port opposing each other at a position close to the substrate in the optical path space, and
 the restricting member may be installed between the two pairs of supply/exhaust ports in a direction substantially along a gas stream.

The gas stream forming mechanism may have a supply port and an exhaust port opposing each other at a position close to the optical system in the local space, and the restricting member may be a plate member installed on the substrate side of the supply port outlet or exhaust port inlet in a direction almost along the gas stream. Alternatively, the gas stream forming mechanism may have two opposing supply ports at a position close to the optical system in the local space, and the restricting member may be a plate member installed on the substrate side of the supply port outlet in a direction almost along the gas stream.

As a device manufacturing method using the above-described exposure apparatus, the following methods are also incorporated in the present invention. A device manufacturing method comprises the steps of exposing a substrate using the above exposure apparatus, and developing the exposed substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 15 is a view showing part of an exposure apparatus according to the fifth embodiment of the present invention;

FIG. 31 is a view showing still another modification of the exposure apparatus shown in FIG. 2 according to the sixth embodiment of the present invention;

FIG. 32 is a view showing part of an exposure apparatus according to the seventh embodiment of the present invention; and FIG. 33 is a view showing an example in which a gas stream forming apparatus is installed in the space between the illumination optical system and the reticle in the sixth embodiment of the present invention.

DETAILED DESCRIPTION OF THE PREFERRED EMBODIMENTS

The preferred embodiments of the present invention will be described below with reference of the accompanying drawings.

First Embodiment

Figure 1:
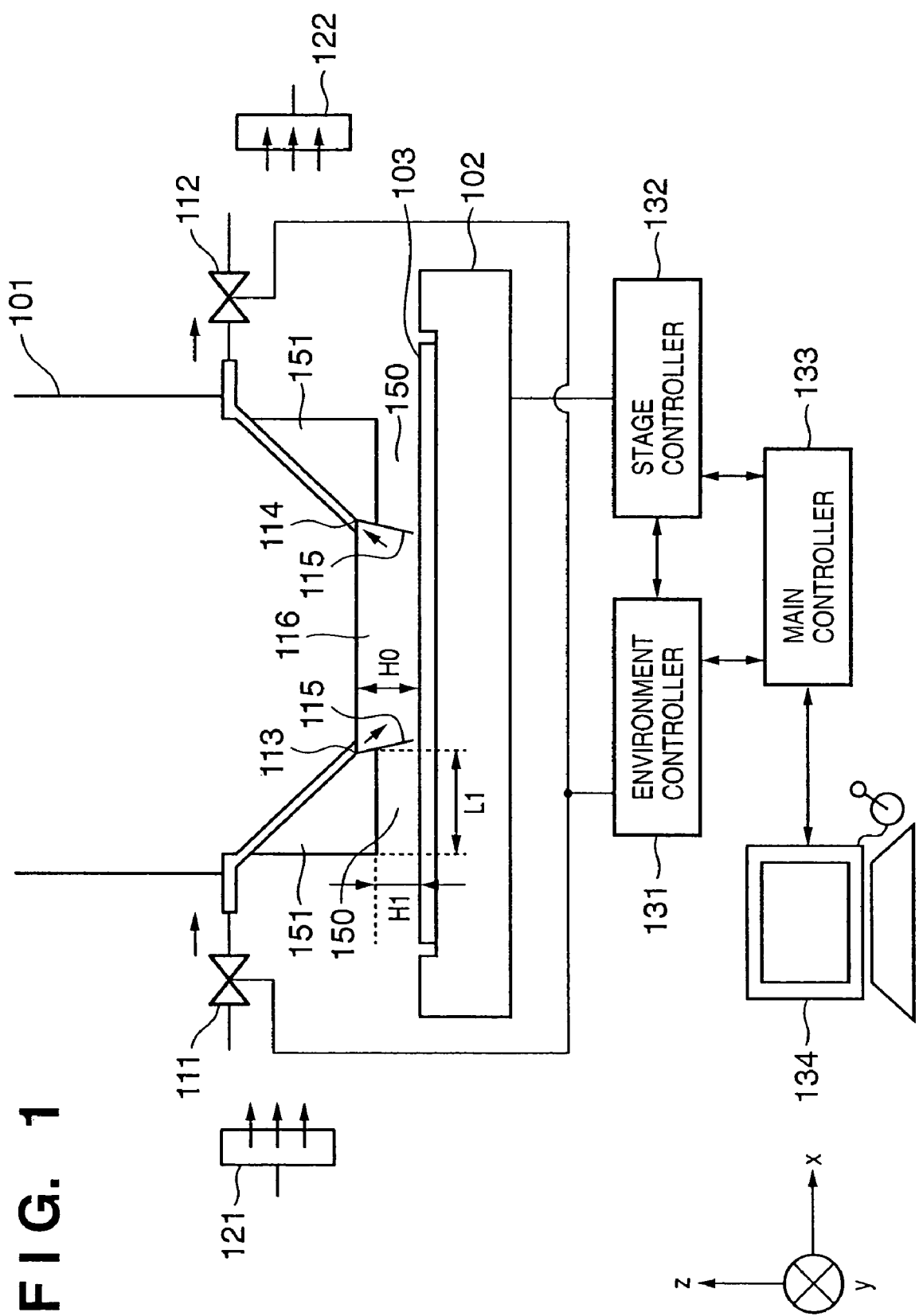
FIG. 1 is a view showing part of an exposure apparatus according to the first embodiment of the present invention.

FIG. 1 is a view showing part of an exposure apparatus according to the first embodiment of the present invention.

This exposure apparatus has a light source such as an $F_2$ excimer laser (not shown) which generates a short-wavelength laser beam as illumination light. The illumination light (exposure light) from the light source uniformly illuminates a reticle (mask) through an appropriate illumination optical member. The light (exposure light) transmitted through the reticle reaches, through various optical members of a projecting optical system 101, the surface of a wafer 103 placed on a wafer stage 102, and forms a reticle pattern on the wafer surface.

The wafer stage 102, having the wafer 103 placed thereon, is designed to be movable in three-dimensional directions (X, Y, and Z directions). The reticle pattern is sequentially projected and transferred onto the wafer 103 by a so-called step-and-repeat scheme that repeats stepping movement and exposure. Even when the present invention is applied to a scanning exposure apparatus, the arrangement is almost the same as described above.

For exposure, a heated and/or cooled inert gas (e.g., nitrogen gas, helium gas, or the like) is supplied from a supply port 113 through a supply valve 111 to a space (to be referred to as an optical path space hereinafter) 116 between the wafer 103 and a shielding member 115 on the lower side of the projecting optical system 101, including the space through which the exposure light passes and the periphery of the space. The inert gas supplied to the periphery of the space. The inert gas supplied to the optical path space 116 is partially recovered from an exhaust port 114 and exhausted through an exhaust valve 112. The supply valve 111, supply port 113, exhaust of a gas stream forming mechanism which forms a stream of a gas, such as an inert gas, in the optical path space 116.

Arrows in FIG. 1 indicate the flow of the inert gas. To transmit alignment light, the shielding member 115 partially has a transparent member.

Basically, the optical path space 116 is set at a positive pressure with respect to the ambient atmosphere (the pressure in the optical path space 116 is made higher than that in the ambient atmosphere), thereby decreasing the oxygen concentration in the exposure atmosphere in the optical path space. For this reason, the amount of inert gas that leaks from the optical path space 116 to the peripheral space is more than the exhaust amount through the exhaust valve 112. The inert gas that has leaked from the optical path space 116 is recovered and exhausted by an exhaust unit 122 together with the ambient atmosphere supplied from a supply unit 121.

The inert gas that has leaked from the optical path space 116 is recovered and exhausted by the exhaust unit 122 together with the ambient atmosphere supplied as a heated and/or cooled gas (dry air or an inert gas having a low concentration) is supplied from the supply unit 121. The temperature around the exposure region is adjusted by the ambient atmosphere.

Opening/closing and the degrees of valve opening of the supply valve 111 and exhaust valve 112 are controlled by an environment controller 131. Since the supply valve 111 and exhaust valve 112 are normally open, the inert gas is always supplied into the optical path space 116 independently of the position of the stage 102. However, when the stage 102 is detached from the lower side of the optical path space 116 to do wafer exchange or maintenance, control may be performed to temporarily stop inert gas supply or reduce the supply amount. Supply may be started or the supply amount may be increased after wafer exchange or after the end of maintenance before the stage 102 moves to the lower side of the optical path space 116 again.

The environment controller 131, a stage controller 132, and other controllers (not shown) are systematically controlled by a main controller 133 in various kinds of operations, including wafer exchange, alignment operation, and exposure operation. The control contents by the main controller 133 and the operation state of the exposure apparatus are monitored by a monitoring device 134.

If the atmosphere in the gap around the wafer 103 or at the step portion on the wafer stage 102 in the region that enters or leaves the optical path space 116 is insufficiently replaced, the ambient atmosphere may be involved in the optical path space when the wafer stage 102 moves. This may increase the oxygen concentration in the optical path space 116.

In the first embodiment, a member 151 is arranged to limit the height of the space around the optical path space 116 (especially, the space near the optical path space 116) and to form a predetermined space 150. Let P1 be the average concentration of the inert gas present in the optical path space 116, and P2 be the average concentration of the inert gas present outside the optical path space. The predetermined space 150 that surrounds the optical path space 116 is formed between the member 151 and the wafer 103 so that an average inert gas concentration P that satisfies:

P2<P<P1 (a first condition)

is maintained. The concentration in the predetermined space 150 near the optical path space 116 is almost equal to the inert gas concentration in the optical path space 116. Toward the outer periphery of the predetermined space 150, the concentration becomes closer to that of the external atmosphere. In other words, the member 151 forms a gap space to the wafer 103, thereby forming the space having the average inert gas concentration P.

The distance H1 from the lower surface (wafer-side surface) of the member 151 for forming the predetermined space 150 to the wafer is set to ½ or less, or more preferably, ⅓ or less of the width L1 of the lower surface of the member 151 in a predetermined direction substantially parallel to the wafer (a second condition). (The distance may be distance to the wafer stage. An expression "the distance between the member 151 or another member and the wafer" in the following description is equivalent to "the distance between the member 151 or another member and the wafer stage." Even for the reticle, the "reticle" can be replaced with the "reticle stage). Then, since the gas hardly flows in the predetermined space, the gas such as oxygen that absorbs exposure light is involved in the optical path space 116 at a low probability. The above "predetermined direction substantially parallel to the wafer" may be "the direction of a straight line at which the plane perpendicular to the wafer, including the direction of gas supply from the supply port 113, and the plane including the wafer surface cross each other", i.e., the "direction of gas stream in the optical path space" or the "scanning exposure direction of the wafer stage 102".

In addition, the height H1 of the predetermined space 150 (the distance between the wafer and the lower surface of the member 151) is preferably less than the distance between the wafer and the optical element of the projecting optical system 101, which is closest to the wafer (a third condition). Preferably, the height of the predetermined space is one-half, and more preferably, one-quarter the distance between the wafer and the optical element of the projecting optical system 101, which is closest to the wafer. Accordingly, the place where the inert gas concentration becomes low can be separated from the optical path space 116, so the inert gas concentration around the optical path space 116 can be stabilized at a high concentration.

The predetermined space 150 may be formed in the optical path space 116 only on the upstream side of the gas stream in the optical path space 116 (on the supply port side in the optical path space 116). The predetermined space 150 may be formed on both the upstream and downstream sides of the gas stream in the optical path space 116. The predetermined space 150 may be formed around the optical path space 116.

Figure 2:
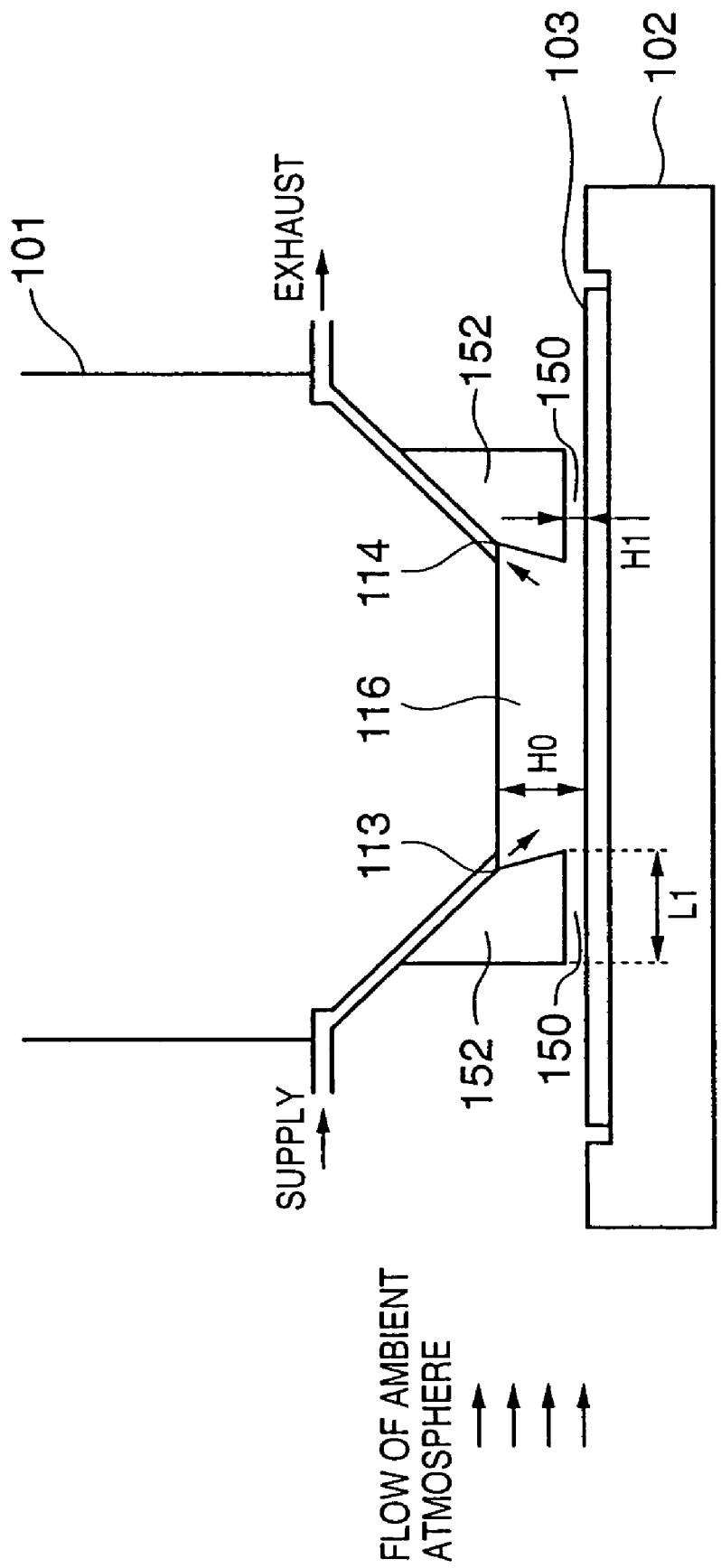
FIG. 2 is a view showing a modification of the exposure apparatus shown in FIG. 1 according to the first embodiment of the present invention.

As a modification, a partitioning member 152 that forms the predetermined space 150 and also partitions the optical path space 116 may be designed, as shown in FIG. 2. The partitioning member 152 is arranged such that the distance between the wafer and the lower surface of the partitioning member 152 becomes shorter than that between the wafer and the optical element of the projecting optical system, which is closest to the wafer. As similar to the above second condition in the modification, when the ratio of the distance H1 from the lower end of the member 152 that forms the predetermined space 150 to the wafer 103 to the width L1 (the width in the direction substantially parallel to the wafer) of the member 152 that forms the predetermined space 150 is represented by 1:X, X is preferably 2 or more and, more preferably, 3 or more. If the X is less than 2, the inert gas concentration under the member 152 that forms the predetermined space 150 becomes considerably low, although it changes depending on the flow speed of the ambient atmosphere, the flow speed of the inert gas that leaks from the optical path space 116, and the driving speed of the wafer stage 102. When the height is limited, the inert gas that has leaked from the optical path space 116 hardly flows. With the collected inert gas, the influence of involvement when the wafer stage 102 moves is suppressed, and the atmosphere collected around the wafer 103 is replaced. Accordingly, the inert gas concentration in the purge space can be stabilized.

Figure 3:
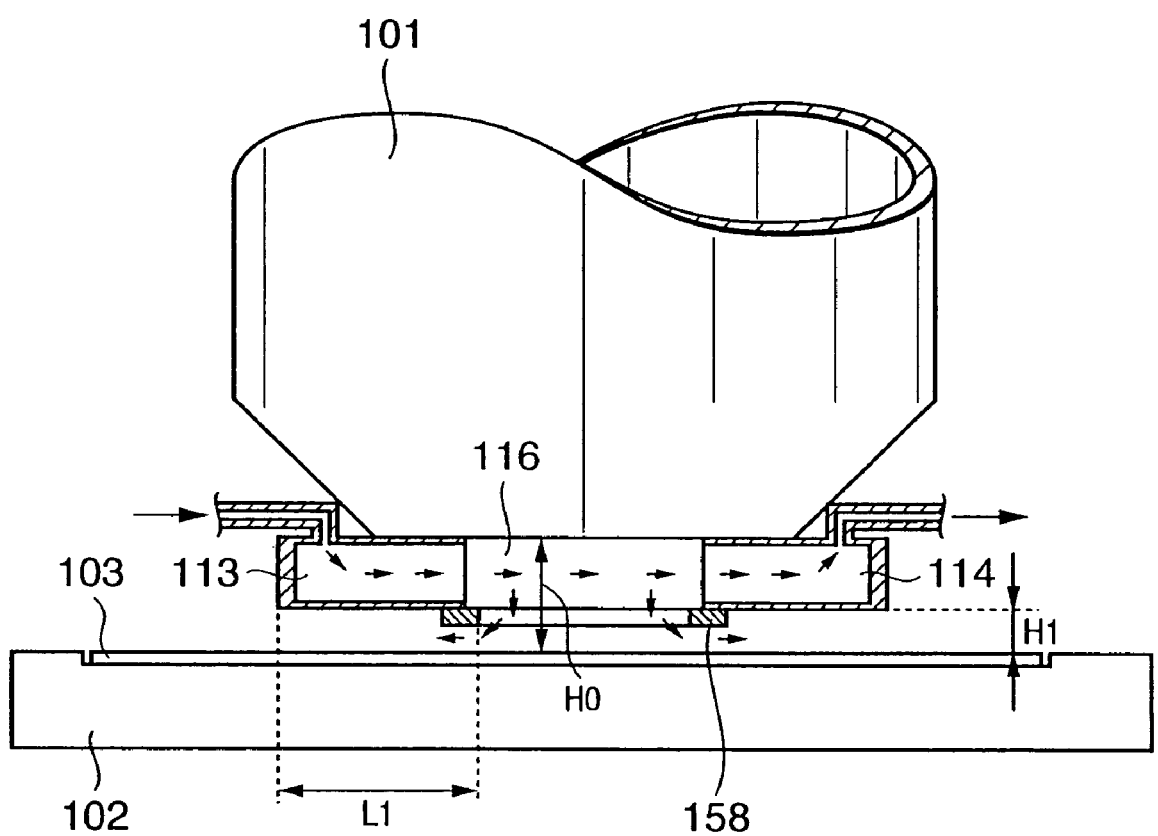
FIG. 3 is a view showing another modification of the exposure apparatus shown in FIG. 1 according to the first embodiment of the present invention.
Figure 4:
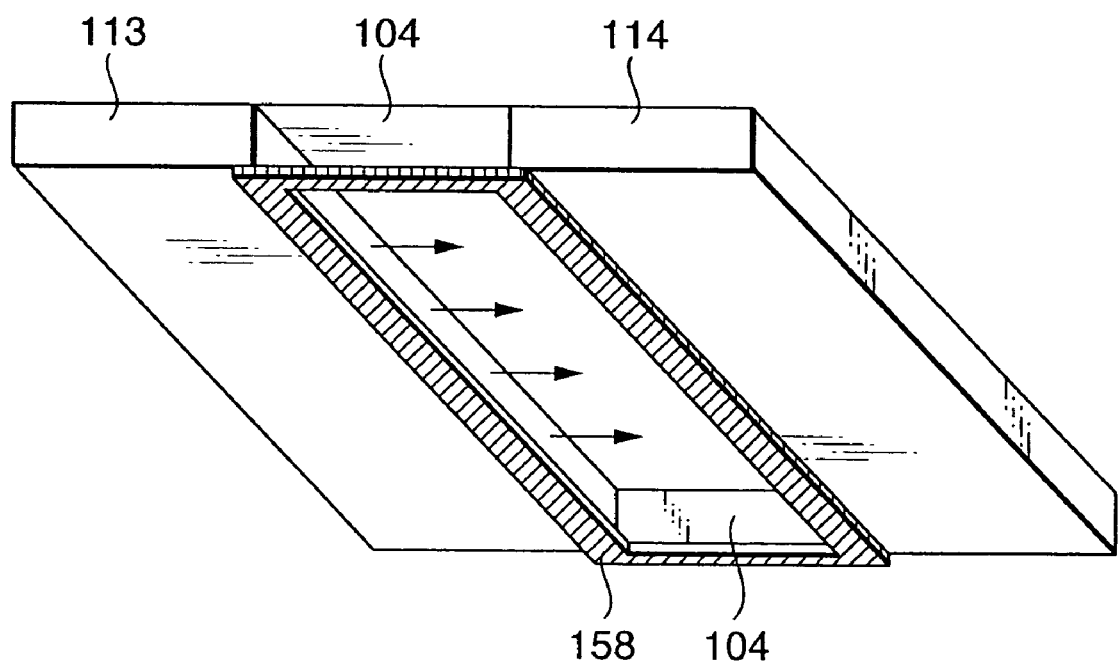
FIG. 4 is a view showing the modification in FIG. 3 viewed from the lower side.

Alternatively, as shown in FIGS. 3 and 4, an opening plate 158 that satisfies the above ratio may be arranged under the optical path space 116. FIG. 3 is a sectional view of an exposure apparatus in which the opening plate 158 is arranged under the optical path space 116 surrounded by a glass member 104 that passes alignment light and by the projecting optical system 101, and the predetermined space 150 (FIG. 2) is formed under the opening plate 158. FIG. 4 is a view of the opening plate 158 viewed from the lower side. In this embodiment, the exhaust port 114 is arranged, though it is not always necessary. A supply port may be formed in place of the exhaust port 114.

The inert gas is supplied from the supply port 113 into the optical path space 116. At the same time, the inert gas may also be supplied to the predetermined space 150 by branching a pipe from the supply means for supplying the gas to the supply port or using another supply means. The predetermined space 150 to which the inert gas is supplied is preferably a predetermined space on the upstream side of the gas stream in the optical path space 116.

Second Embodiment

Figure 5:
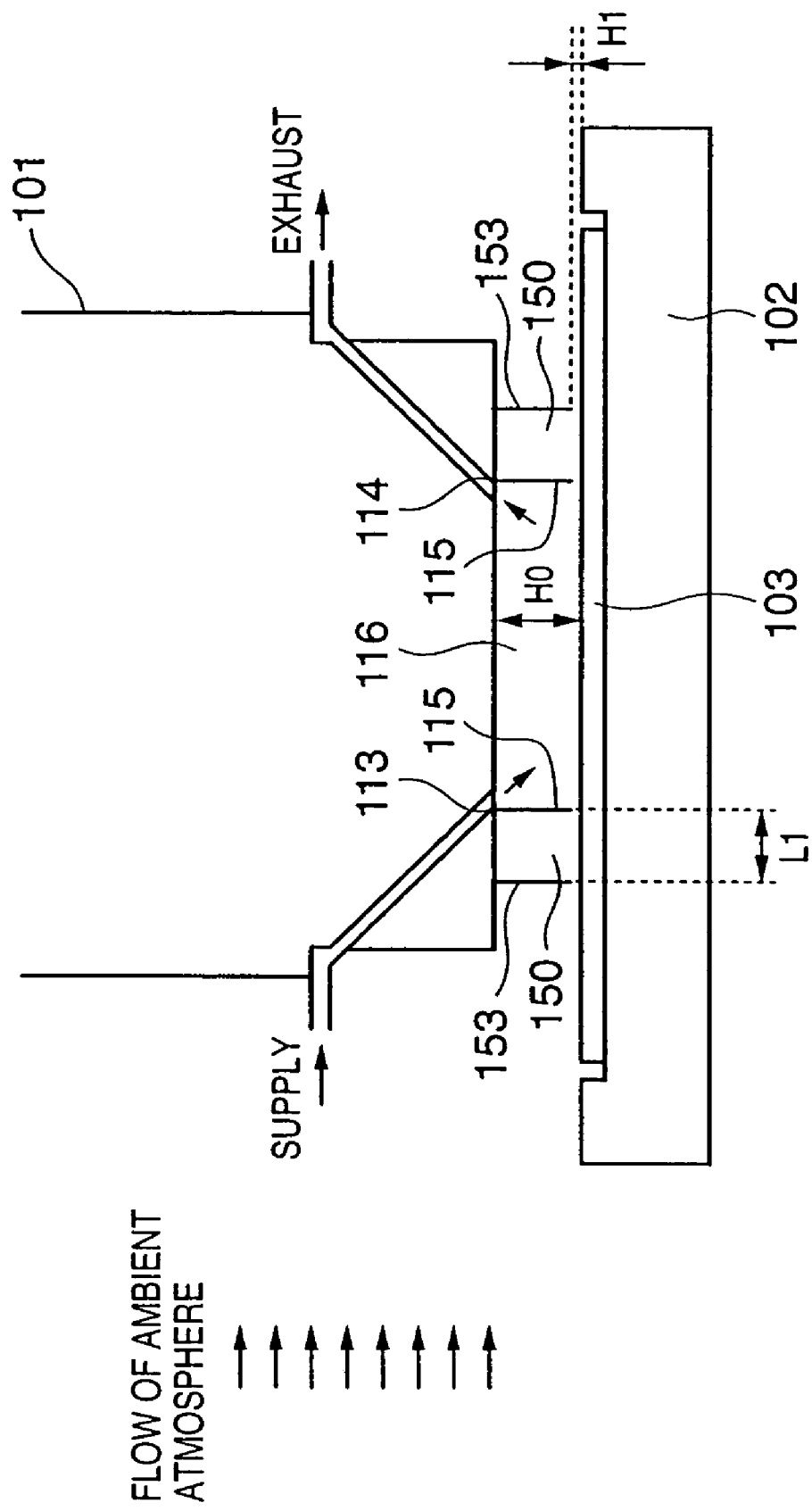
FIG. 5 is a view showing part of an exposure apparatus according to the second embodiment of the present invention.

In the second embodiment, the member that forms a predetermined space 150 has, at its lower portion, partitioning member 153 that surround the periphery of an optical path space 116 multiple-fold (twofold together with a shielding member 115 in FIG. 5) as shown in FIG. 5. When an inert gas that has leaked from the optical path space 116 is collected in a groove (a concave portion) formed by the partitioning members 153, the atmosphere collected at the step and gap around a wafer 103 can be replaced. In addition, the influence of involvement by a wafer stage 102 or the influence of ambient atmosphere can be suppressed. Especially, in FIG. 5, the partitioning member 153 is arranged outside the optical path space 116 to surround the optical path space 116. Referring to FIG. 5, the distance from the lower end of the partitioning member 153 to the wafer 103 is substantially equal to that from the lower end of the shielding member 115 to the wafer 103. However, the distances may be different.

Figure 6:
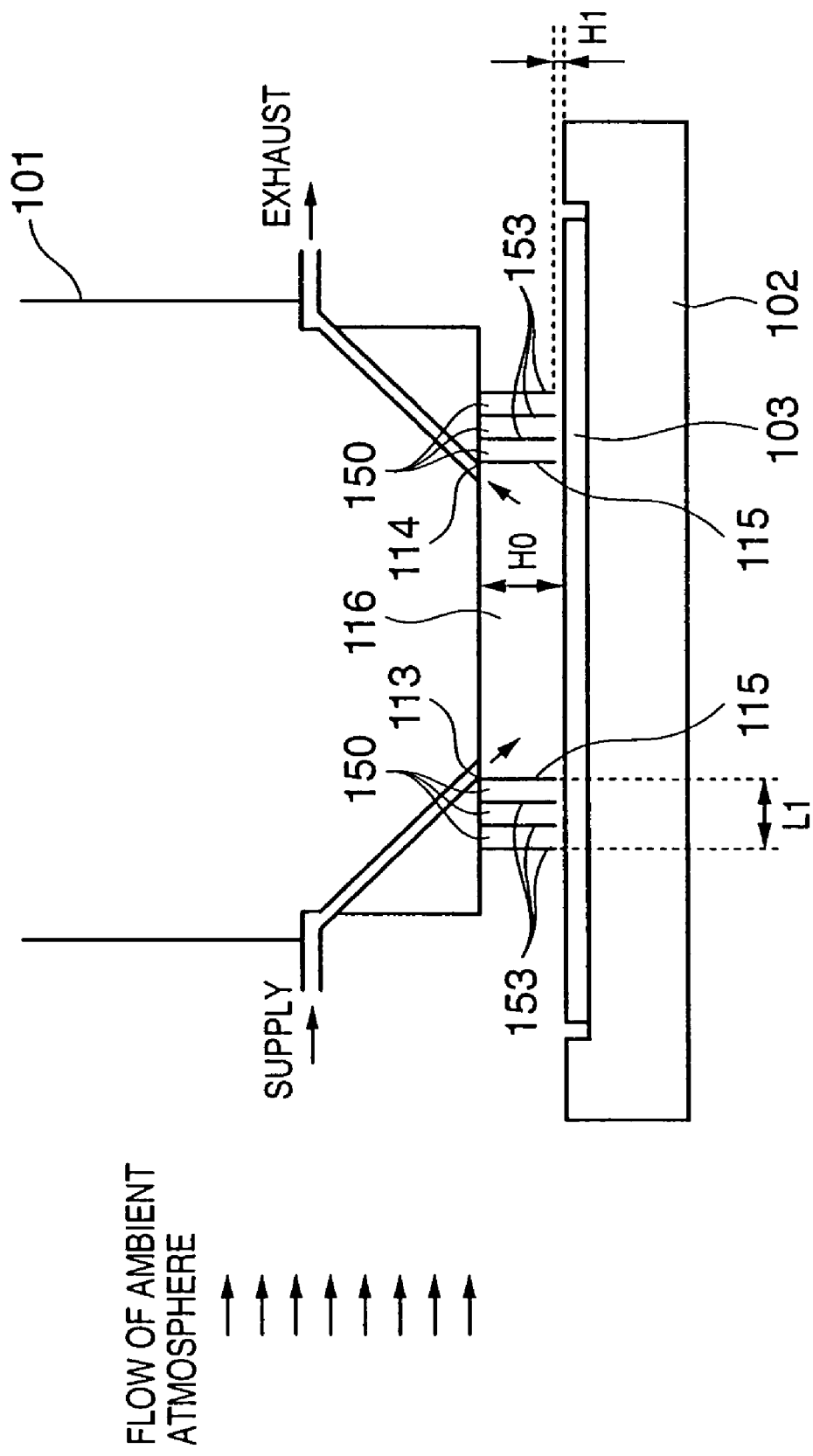
FIG. 6 is a view showing a modification of the exposure apparatus shown in FIG. 5 according to the second embodiment of the present invention.

As a modification, FIG. 6 shown an arrangement having a plurality of partitioning members 153. As the number of partitioning members 153 increases, the concentration of the collected inert gas can be increased toward the optical path space 166. Hence, the atmosphere in the groove or at the step around the wafer 103 can be replaced at a more separated portion of the optical path space 116. For this reason, the inert gas concentration in the optical path space 116 can be stabilized at a higher concentration.

Figure 7:
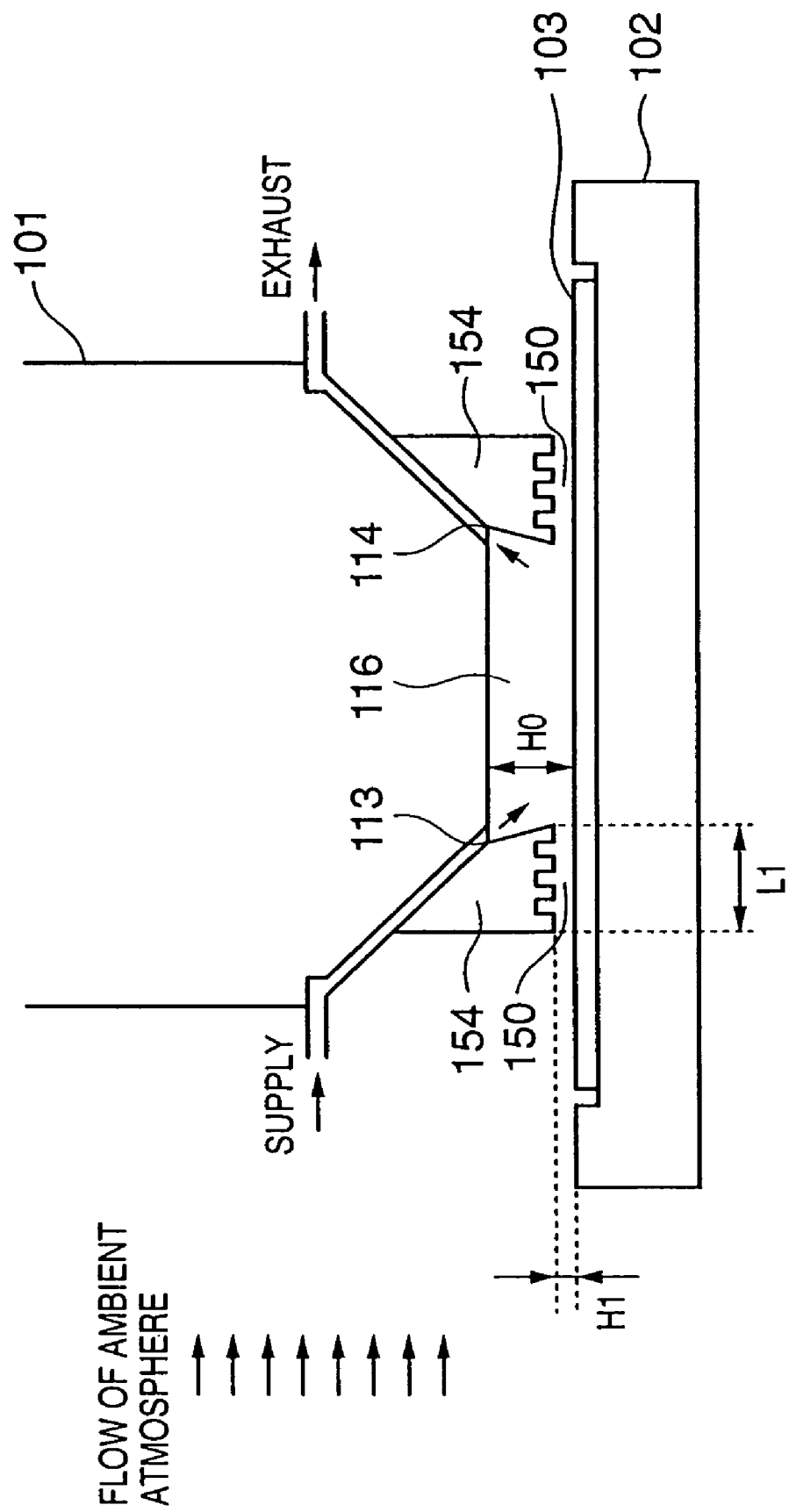
FIG. 7 is a view showing part of another exposure apparatus according to the second embodiment of the present invention.

As another modification, when a member 154 having a plurality of grooves is arranged under the partitioning member 152 that forms the predetermined space 150 of the first embodiment shown in FIG. 1, as shown in FIG. 7, the same effect as described above can be obtained. The grooves are arranged to surround the optical path space 116 multiple-fold, like the partitioning member 152 or partitioning members 153 shown in FIG. 5 or 6. The depth of the groove is preferably equal to or less than the height from the final optical member under a projecting optical system 101 to the wafer 103. If the groove is too deep, replacement in the groove requires time. Hence, a long time is required to replace the atmosphere collected in the gap or at the step around the wafer 103.

The distance between the partitioning member 153 and the shielding member 115 that shields the optical path space 116 from the ambient atmosphere in FIG. 5, the distance between the shielding member 115 and one of the partitioning members 153, which is most closed to the optical axis of the projecting optical system 101, in FIG. 6, or the width of the member 154 in a plane parallel to the page surface and including the optical axis of the projecting optical system (in other words, the above-described width in "a direction substantially parallel to the wafer") in FIG. 7 is preferably equal to or more than twice the distance between the wafer and one of the lower ends of the shielding member 115 and partitioning members 153, which is closest to the wafer, in FIG. 5 or 6, or equal to or more than twice the distance between the wafer and the lower surface of the member 154 in FIG. 7. More preferably, the distance is not twice, but three times or more.

Figure 9:
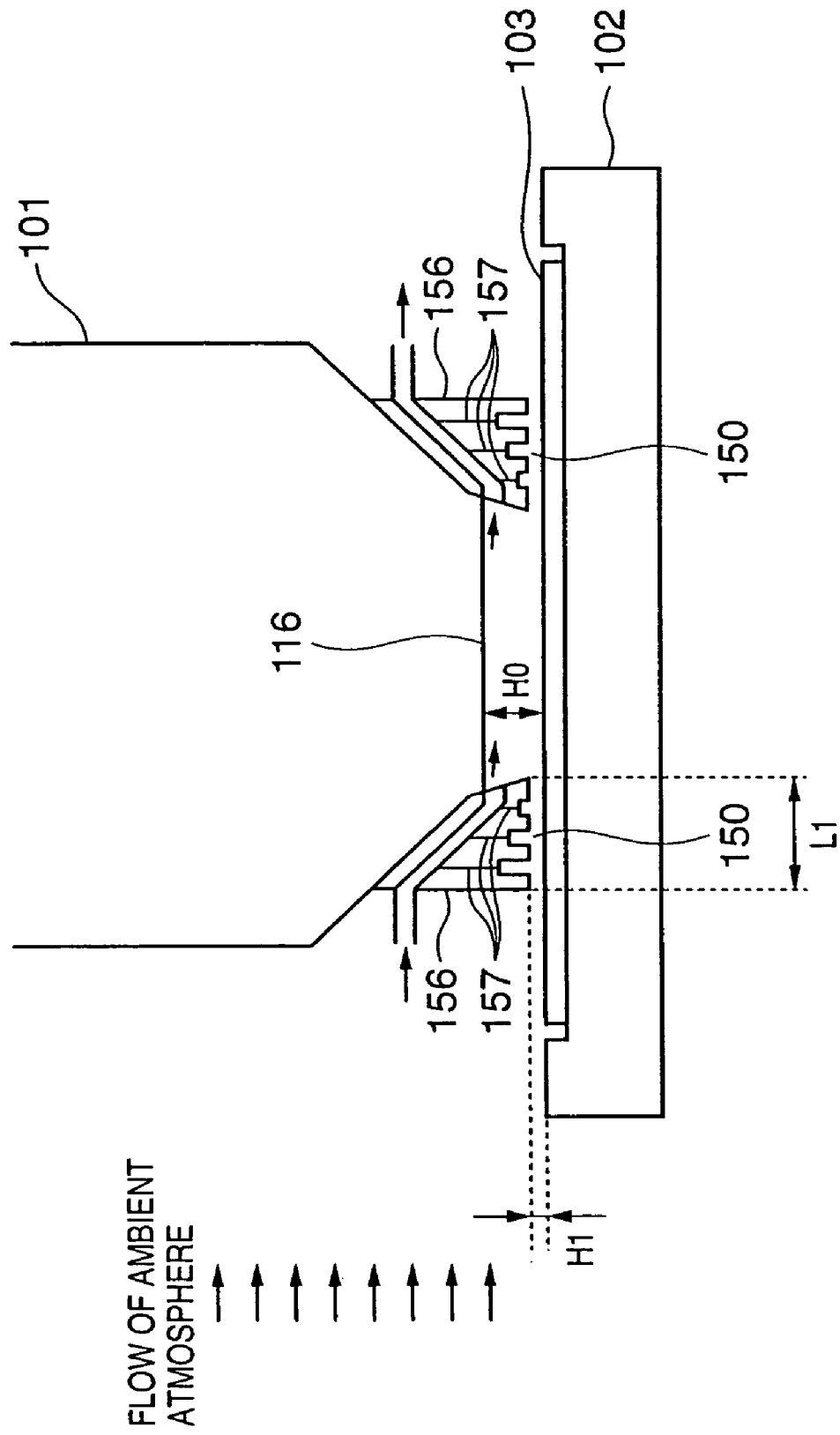
FIG. 9 is a view showing a modification of the exposure apparatus shown in FIG. 8 according to the third embodiment of the present invention.
Figure 10:
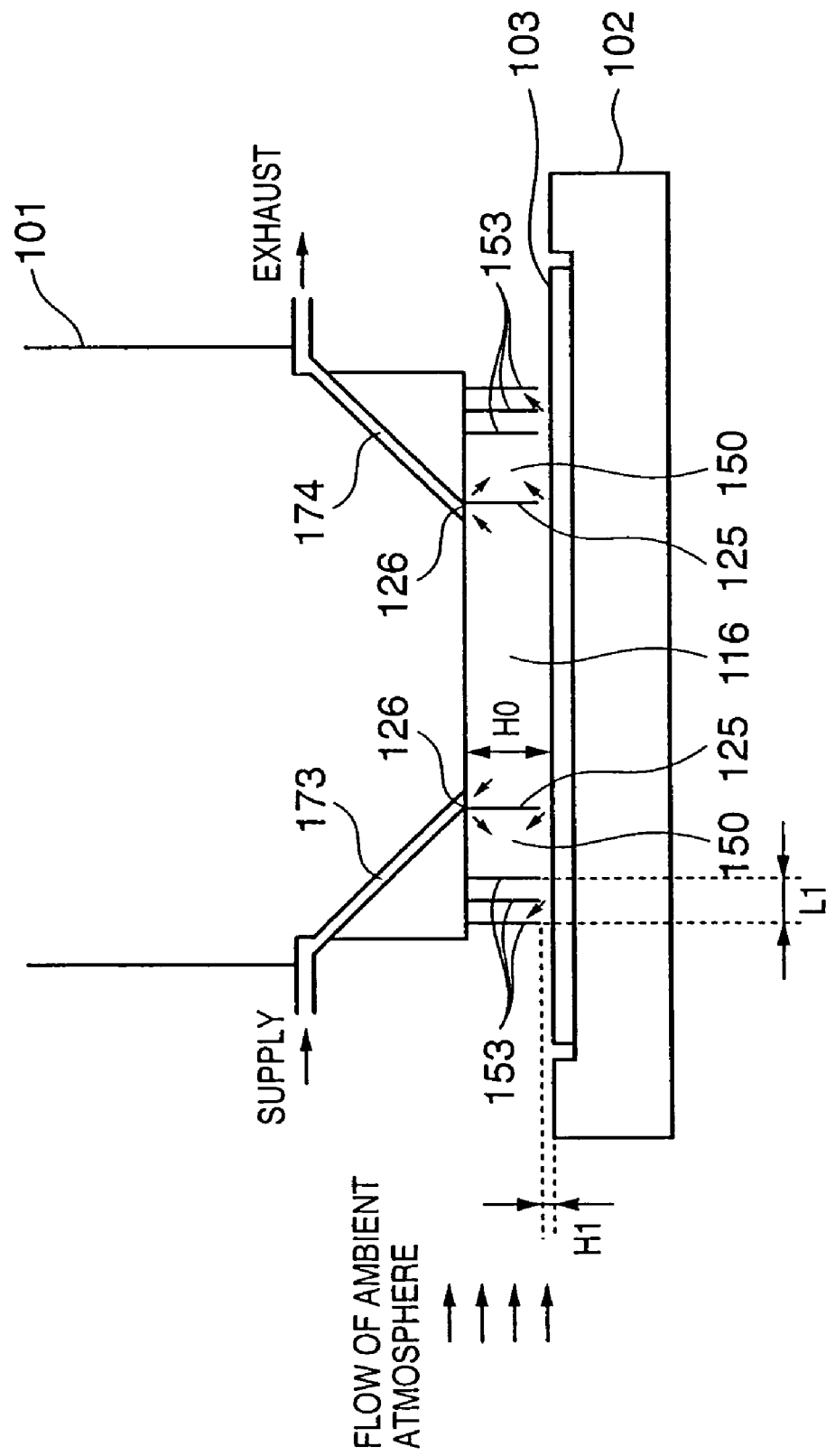
FIG. 10 is a view showing another exposure apparatus according to the third embodiment of the present invention.

The inert gas is supplied from the supply port 113 into the optical path space 116. At the same time, the inert gas may also be supplied to one or a plurality of predetermined spaces 150 by branching a pipe from the supply means for supplying the gas to the supply port or using another supply means (FIGS. 9 and 10 to be described later). The predetermined space 150, to which the inert gas is supplied, is preferably a predetermined space 150 arranged on the upstream side of the gas stream in the optical path space 116. For the exhaust side as well, the gas may be exhausted from the predetermined space 150 in a similar way. For the exhaust side, the gas is preferably exhausted from the predetermined space 150 arranged on the downstream side of the gas stream.

Third Embodiment

Figure 8:
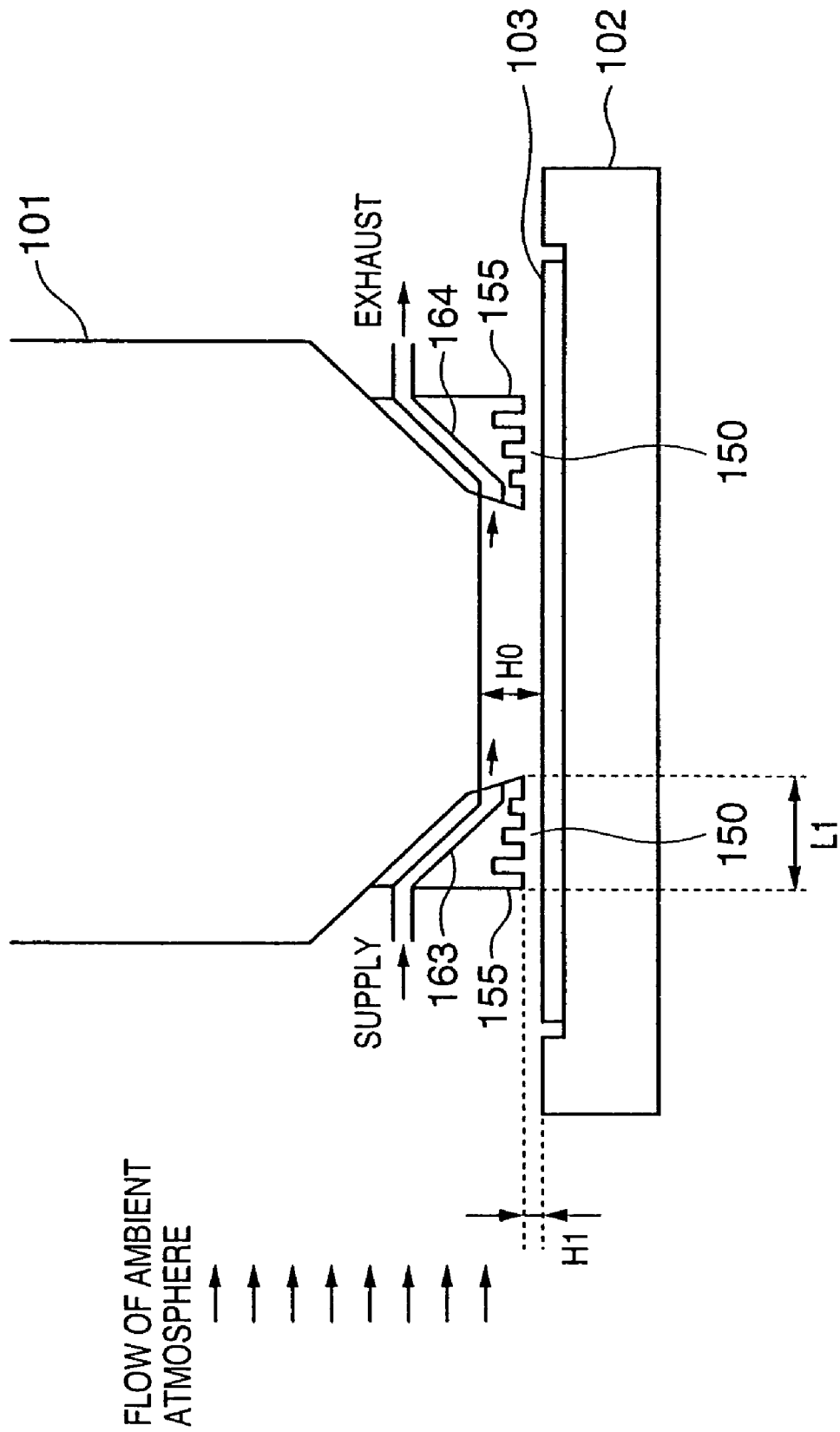
FIG. 8 is a view showing part of an exposure apparatus according to the third embodiment of the present invention.

In the third embodiment, the member 154, supply port 113, and exhaust port 114 of the second embodiment shown in FIG. 7 are integrated to form a member 155 having a supply port 163 and an exhaust port 164 inside, as shown in FIG. 8. With this arrangement, the number of components can be reduced. As for the depths of the grooves formed in the member 155, the groove around an optical path space 116 is shallowest, i.e., the grooves become shallow inside the member 155 centered on the optical path space 116 and deep outside.

The inner grooves of the member 155 are made shallow to shorten the replacement time at the inner part and maintain a high concentration at the inner part. The outer grooves of the member 155 are made deep to increase the volume and to suppress a decrease in inert gas concentration due to entrance of ambient atmosphere because the outer part is readily influenced by the ambient atmosphere, and the internal inert gas concentration abruptly decreases due to a transient change if the volume is small. Transient phenomena include abrupt reverse driving of a wafer stage 102 or entrance of a step or groove around the wafer 103 into the optical path space 116.

In FIG. 8, the grooves formed in the member 155 become shallow toward the optical path space 116. Instead of changing the depth, even when the width of the groove is increased outward from the optical path space 116, the same effect as described above can be obtained.

As a modification, when a member 156 having openings 157 that extend from the supply port 163 and exhaust port 164 in the member 155 shown in FIG. 8 to the multiple grooves is arranged, as shown in FIG. 9, the atmosphere in the grooves can be effectively replaced. In this case, the openings 157 to the grooves must be much smaller than the openings of the supply port 163 and exhaust port 164. When the openings 157 are large, the atmosphere in the grooves enters the supply port 163 and exhaust port 164 to decrease the inert gas concentration in the optical path space 116. In addition, the openings 157 corresponding to the grooves preferably become outwardly smaller.

To decrease the number of components, the member that forms the predetermined space 150, the supply port, and the exhaust port may be integrated even as shown in FIG. 1 or 2 of the first embodiment or FIG. 5 of the second embodiment.

As another modification, to increase the exhaust efficiency in the optical path space 116, as shown in FIG. 10, a shielding member 125 is formed by forming openings 126 in the shielding member 115 that forms the optical path space 116 in the arrangement of the second embodiment shown in FIG. 6 such that the inert gas that has leaked from the openings 126 can blow in the partitioning members 153, like the inert gas that has leaked from the lower side of the optical path space 116.

In this case, when the openings 126 are formed at portions where the flow speed in the optical path space 116 decreases, the exhaust efficiency in the optical path space 116 can be increased. Accordingly, the replacement time in the optical path space 116 can be shortened. The distance from the lower end of the partitioning members 153 to the wafer 103 is preferably larger than the distance from the lower end of the shielding member 125 to the wafer 103.

In the above embodiments, the optical path space 116 has an exhaust port. When recovery of ambient atmosphere is taken into consideration, the exhaust port may be used as another supply port. When the exhaust port is used as a supply port, the influence of ambient atmosphere can be further suppressed even when the consumption amount is kept unchanged.

Fourth Embodiment

Figure 11:
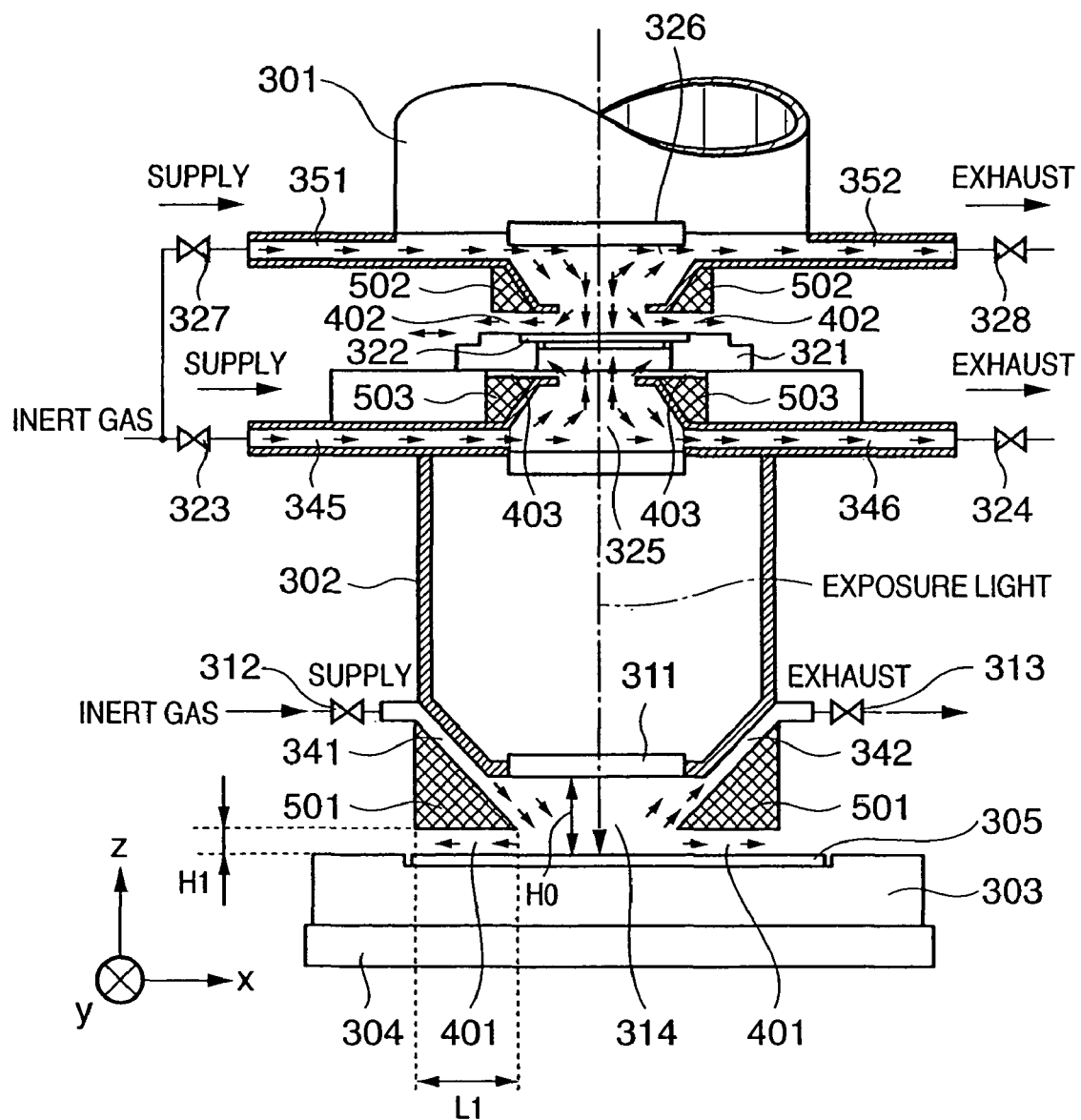
FIG. 11 is a view showing part of an exposure apparatus according to the fourth embodiment of the present invention including the periphery of a reticle.
Figure 12:
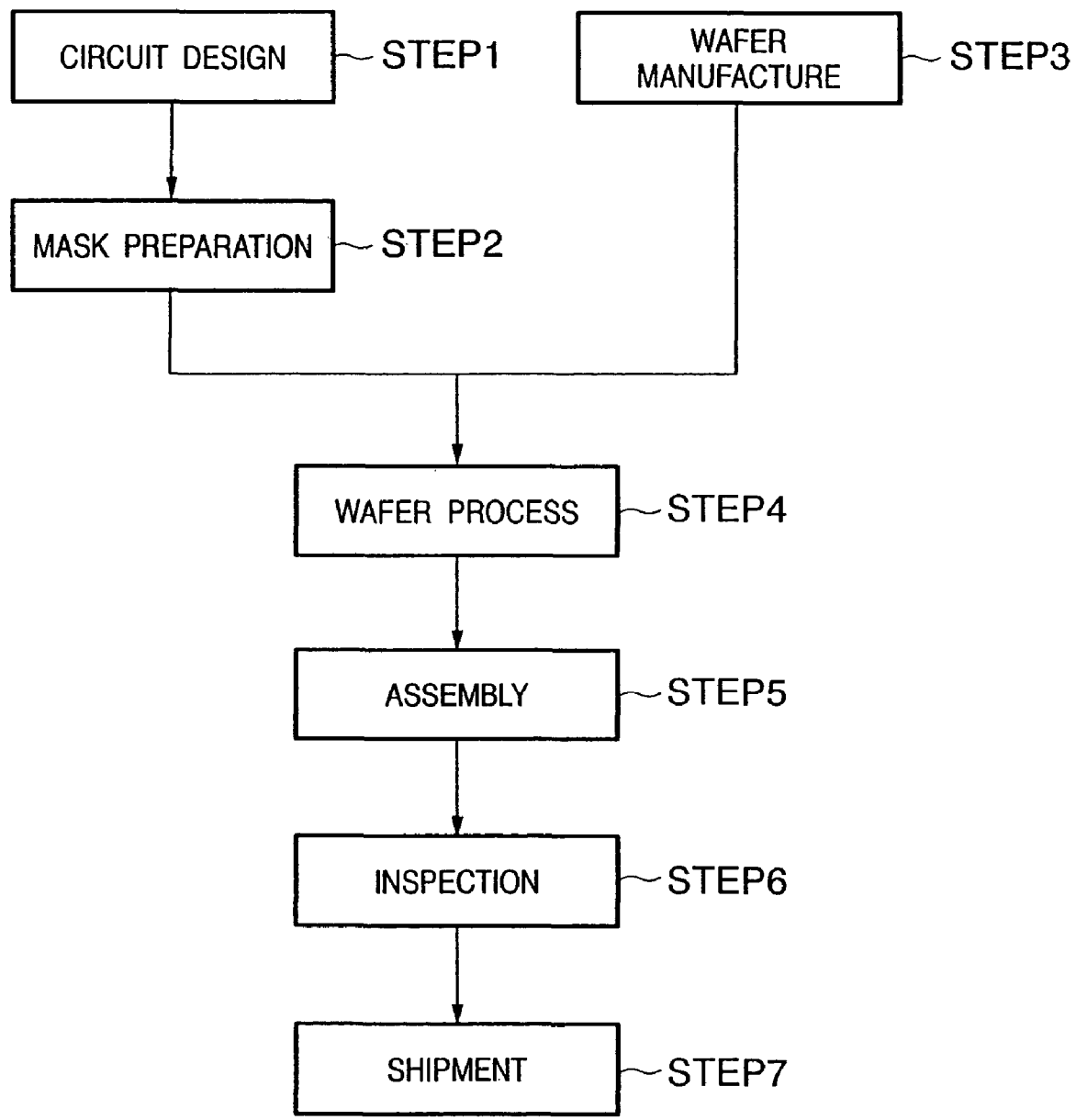
FIG. 12 is a flow chart of the overall manufacturing process of a semiconductor device.

The present invention applied to the space between the projection optical system and the wafer stage in the first to third embodiments can also be applied to the space between an illumination optical system and a reticle stage and the space between the reticle stage and the projecting optical system. FIG. 11 is a view showing an exposure apparatus in which the present invention is applied to the space between the projecting optical system and the wafer stage, the space between the illumination optical system and the reticle stage, and the space between the reticle stage and the projecting optical system.

In the exposure apparatus shown in FIG. 11, for a first optical path space 314 between a final optical member (cover glass) 311 of a projecting optical system 302 and a wafer chuck 303 (wafer 305), a first supply unit 341, which supplies an inert gas to the first optical path space 314 through a supply valve 312, and a first exhaust unit 342, which exhausts the inert gas, and the like, from the first optical path space 314 through an exhaust valve 313 are arranged. A member 501, which forms a first predetermined space 401 for limiting the height around the first optical path space 314, is arranged. With this arrangement, a portion where the inert gas concentration decreases can be separated from the first optical path space 314, and the inert gas concentration around the first optical path space 314 can be stabilized at a high concentration.

For a second optical path space 326 between an illumination optical system 301, which illuminates a reticle (mask) 322 and a reticle stage (reticle 322) 321, a second supply unit 351, which supplies an inert gas to the second optical path space 326 through a supply valve 327, and a second exhaust unit 352, which exhausts the inert gas, and the like, from the second optical path space 326 through an exhaust valve 328 are arranged. A member 502, which forms a second predetermined space 402 for limiting the height around the second optical path space 326, is arranged. With this arrangement, a portion where the inert gas concentration decreases can be separated from the second optical path space 326, and the inert gas concentration around the second optical path space 326 can be stabilized at a high concentration.

For a third optical path space 325 between the reticle stage 321 and the projecting optical system 302, a third supply unit 345, which supplies an inert gas to the third optical path space 325 through a supply valve 323, and a third exhaust unit 346, which exhausts the inert gas, and the like, from the third optical path space 325 through an exhaust valve 324, are arranged. A member 503, which forms a third predetermined space 403 for limiting the height around the third optical space 325, is arranged. With this arrangement, a portion where the inert gas concentration decreases can be separated from the third optical path space 325, and the inert gas concentration around the third optical path space 325 can be stabilized at a high concentration.

In this way, the inert gas concentration around the first to third optical path spaces 314, 326, and 325 can be stabilized at a high concentration.

As in the first embodiment, in the exposure apparatus shown in FIG. 11, opening/closing and the degrees of valve opening of the supply and exhaust valves are controlled by an environment controller (not shown). The reticle stage 321 is controlled by a stage controller (not shown) in synchronism with a wafer stage 304. The environment controller, stage controller, and other controllers (not shown) are systematically controlled by a main controller (not shown) in various kinds of operations including wafer exchange, alignment operation, and exposure operation. The control contents by the main controller and the operation state of the exposure apparatus are monitored by a monitoring device (not shown).

The form of formation of the predetermined space for maintaining the average concentration P of the inert gas may be replaced with that described in the second or third embodiment.

Fifth Embodiment

FIG. 15 is a view showing part of an exposure apparatus according to the fifth embodiment of the present invention.

An inert gas is supplied from a supply port 113 through a supply valve 111 into an optical path space 116. The inert gas supplied into the optical path space 116 is partially recovered from an exhaust port 14 through an exhaust valve 112.

Figure 16:
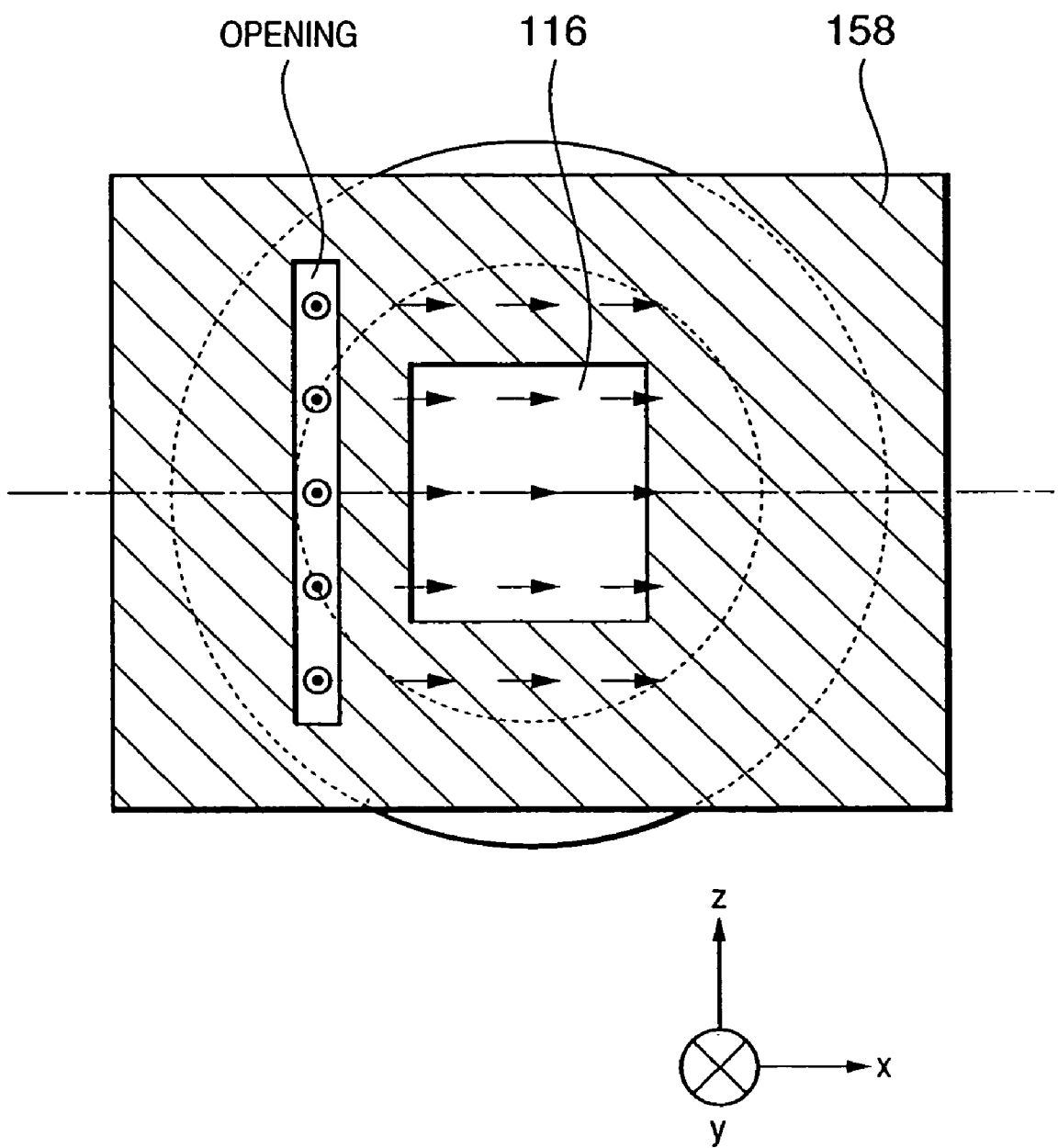
FIG. 16 is a view of the exposure apparatus of the fifth embodiment shown in FIG. 15, which is viewed from the lower side at the position of the opening plate.

When the inert gas is supplied from one direction, the amount of inert gas that leaks from the optical path space 116 to a predetermined space 150 is larger in the +X direction (exhaust port side). If the distance from an opening plate 157 to the surface of a wafer 103 is long, the leakage amount difference becomes conspicuous. A supply port, which injects the inert gas from the lower surface of the wafer 103, is added. FIG. 16 is a view of the opening plate 157 in FIG. 15, which is viewed from the lower side (−Y direction). When slit-like openings are added to the supply port 113 and opening plate 157, the inert gas concentration in the predetermined space 150 on the lower side of the supply port 113 can be stabilized at a high concentration.

Figure 17:
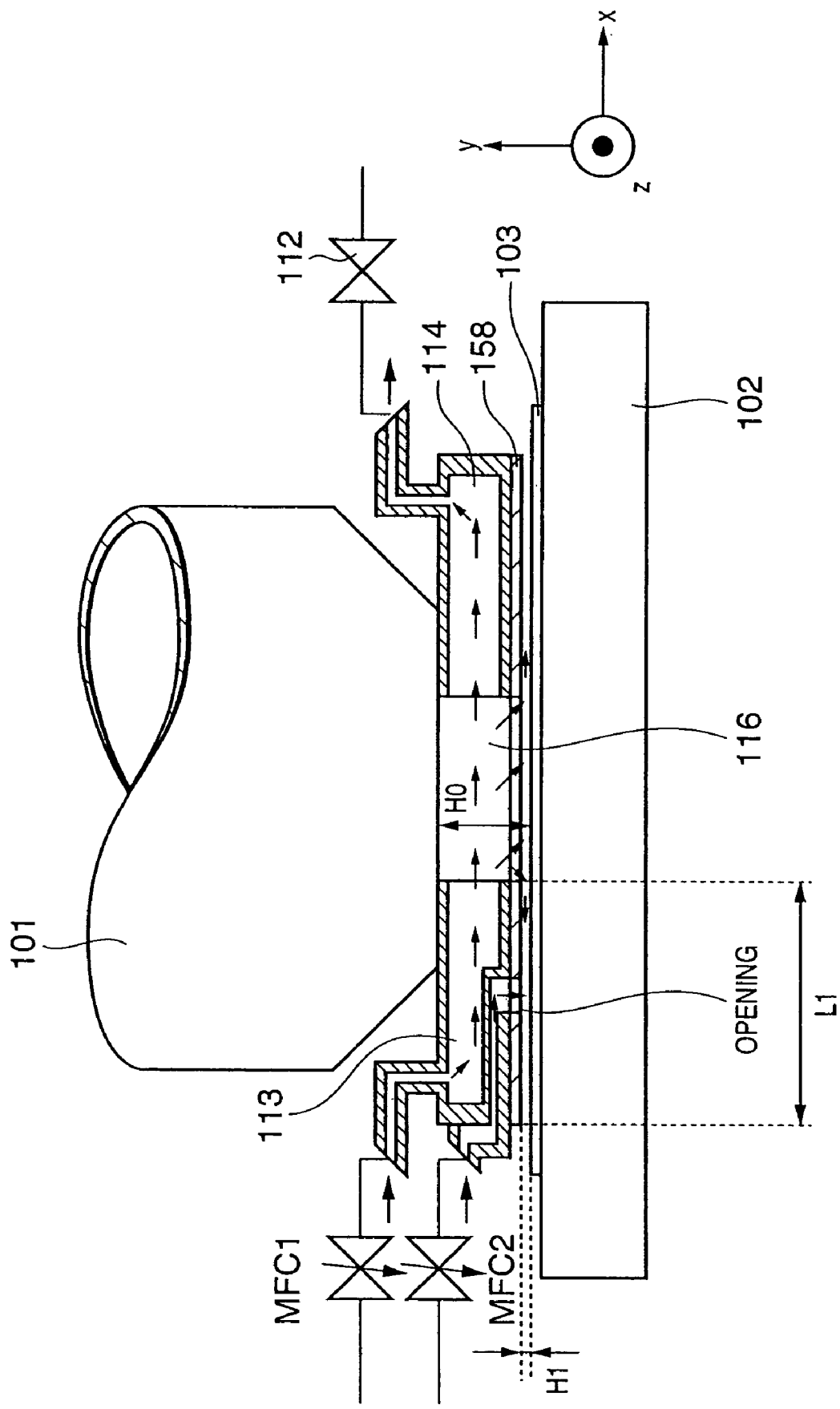
FIG. 17 is a view showing part of another exposure apparatus according to the fifth embodiment of the present invention.

As a modification, supply of the inert gas to the optical path space 116 and supply of the inert gas to the predetermined space 150 may be separated, and the supply amounts may be controlled by separate mass flow controllers MFC1 and MFC2, as shown in FIG. 17. In FIG. 15, when the inert gas is supplied from the opening into the predetermined space 150, the atmosphere around the stage is involved at the time of stage movement. The inert gas concentration near the opening decreases, and even the inert gas concentration in the supply port 113 may sometimes decrease. However, when the supply systems are separated, as shown in FIG. 17, the concentration of the inert gas supplied from the supply port 113 can be stabilized at a high concentration.

In FIG. 16, a slit-like opening is formed. As a modification, when an arc opening is arranged to surround the optical path space 116, as shown in FIG. 18, the influence of the atmosphere around the optical path space 116 can be further suppressed.

Figure 19:
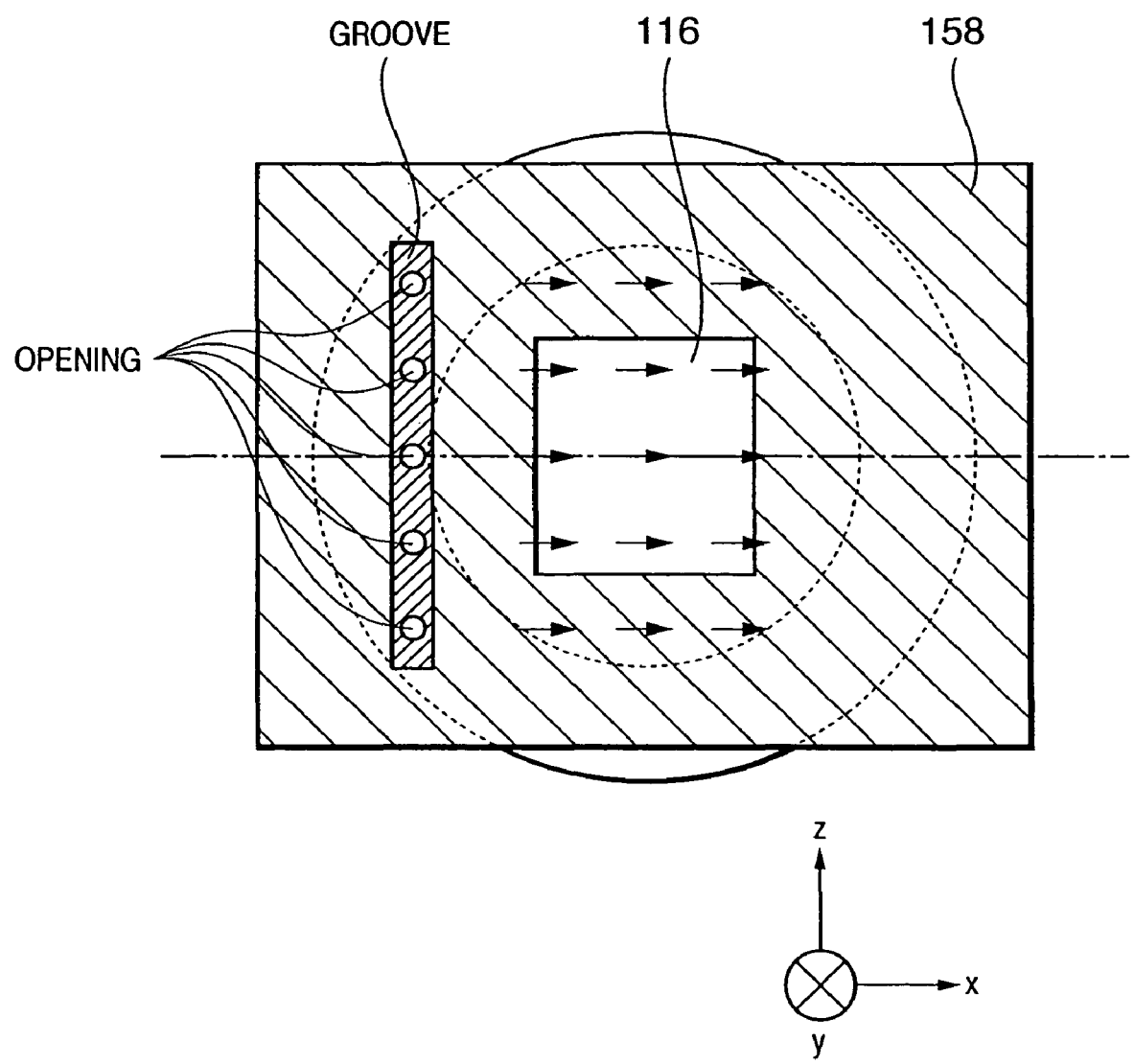
FIG. 19 is a view showing another modification of the exposure apparatus shown in FIG. 16 according to the fifth embodiment of the present invention.

As still another modification, as shown in FIG. 19, a groove may be formed on the predetermined space 150 side of the place where the opening plate 157 shown in FIG. 16 has openings, and a plurality of openings (five openings in FIG. 19) may be formed in the groove to inject the inert gas from the opening plate 157 to the wafer surface side. When the distance from the opening plate 157 to the surface of the wafer 103 is as short as 2 mm or less, the groove is filled with the inert gas. Hence, the inert gas concentration in the predetermined space 150 on the lower side of the supply port 113 can be stabilized at a high concentration. The size of the opening shown in FIG. 19 can be minimized as compared to the size of the opening shown in FIG. 16. For this reason, even when the ambient atmosphere is involved, the decrease in inert gas to the supply source can be suppressed.

Figure 18:
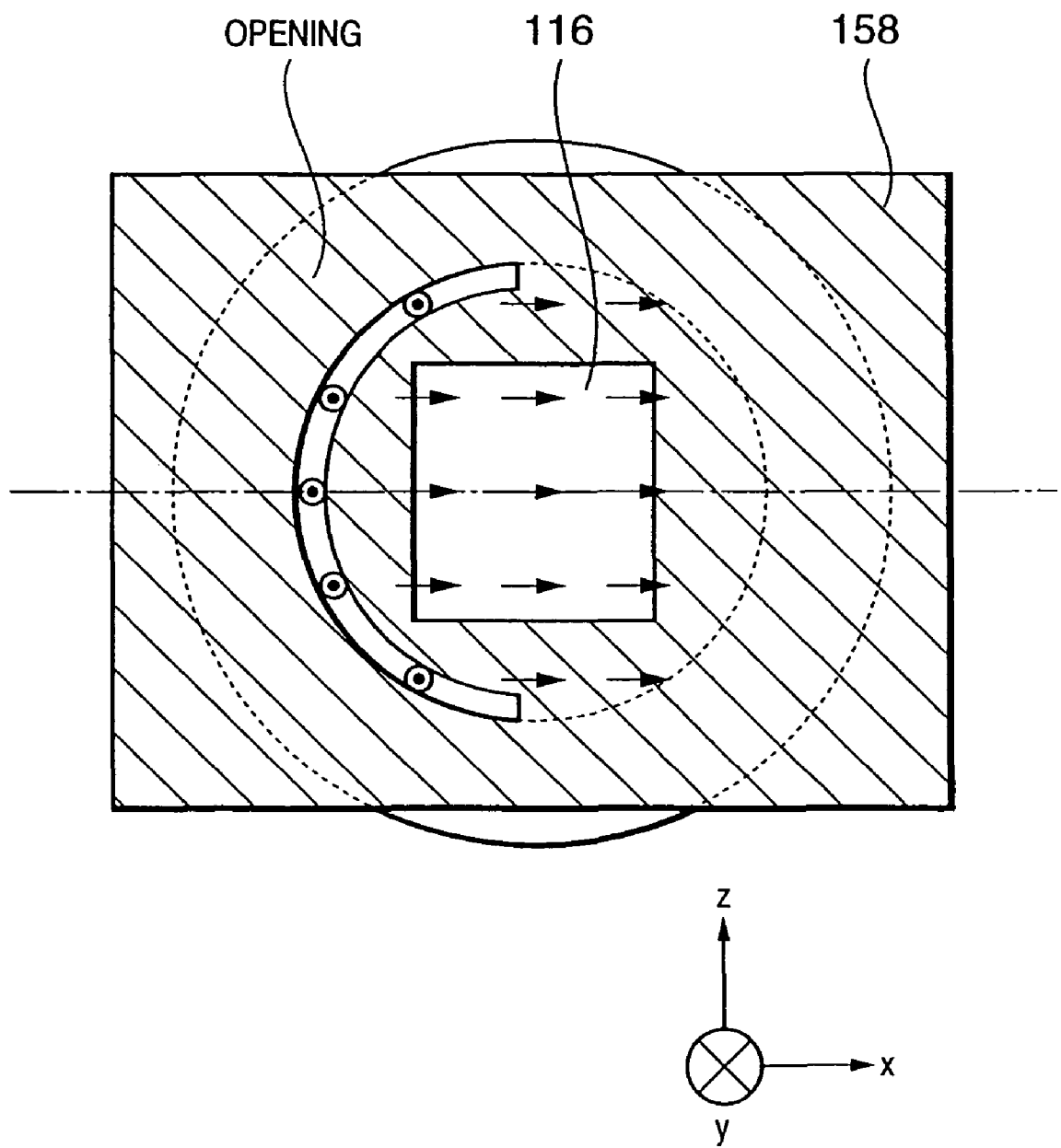
FIG. 18 is a view showing a modification of the exposure apparatus shown in FIG. 16 according to the fifth embodiment of the present invention.

In FIGS. 18 and 19 as well, the inert gas may be commonly supplied to the optical path space 116 and predetermined space 150, as shown in FIG. 15. Alternatively, as shown in FIG. 17, supply of the inert gas to the predetermined space 150 may be separated. When the supply amounts are controlled by the separate mass flow controllers MFC1 and MFC2, the concentration of the inert gas supplied from the supply port 113 can be stabilized at a high concentration.

Figure 20:
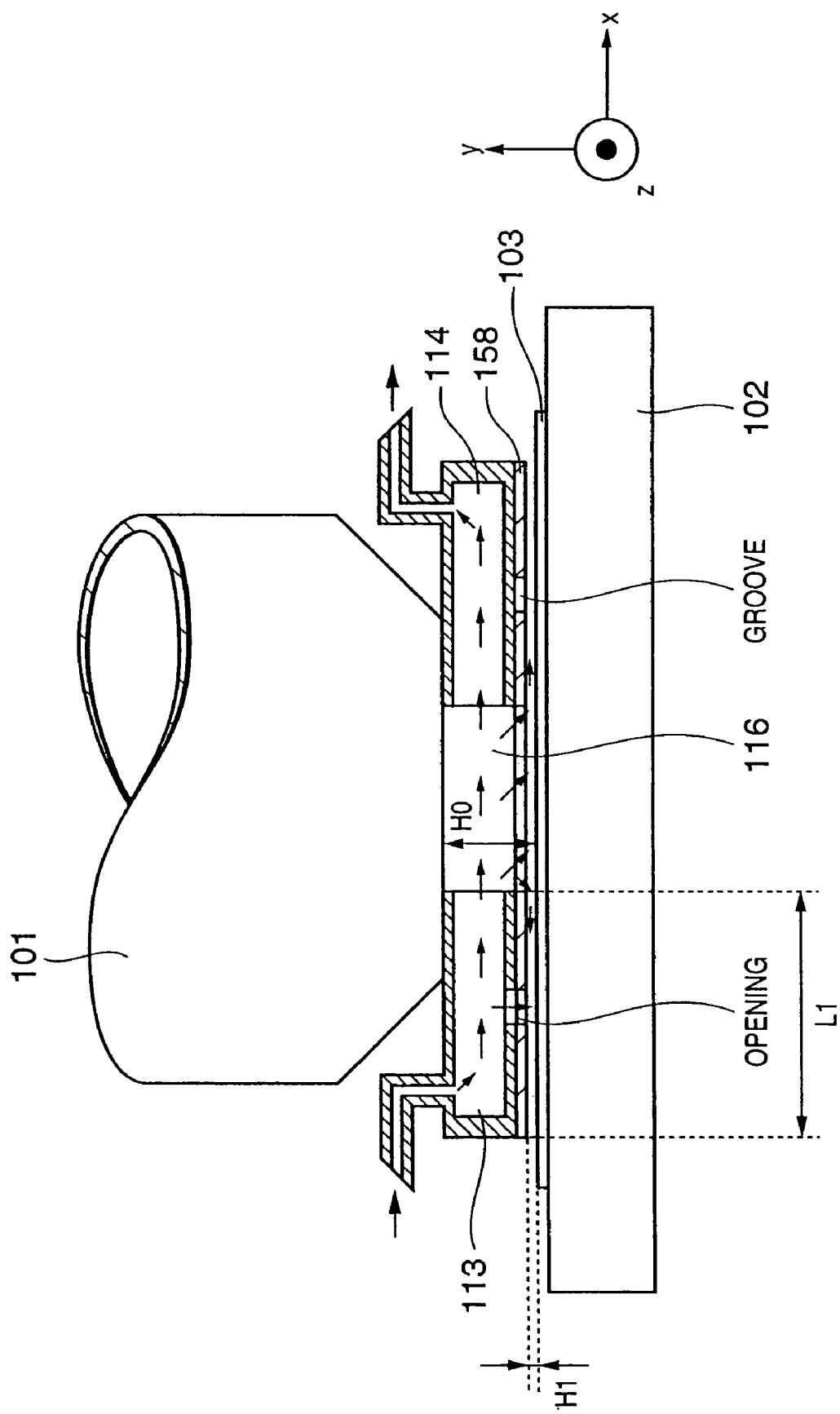
FIG. 20 is a view showing part of still another exposure apparatus according to the fifth embodiment of the present invention.
Figure 21:
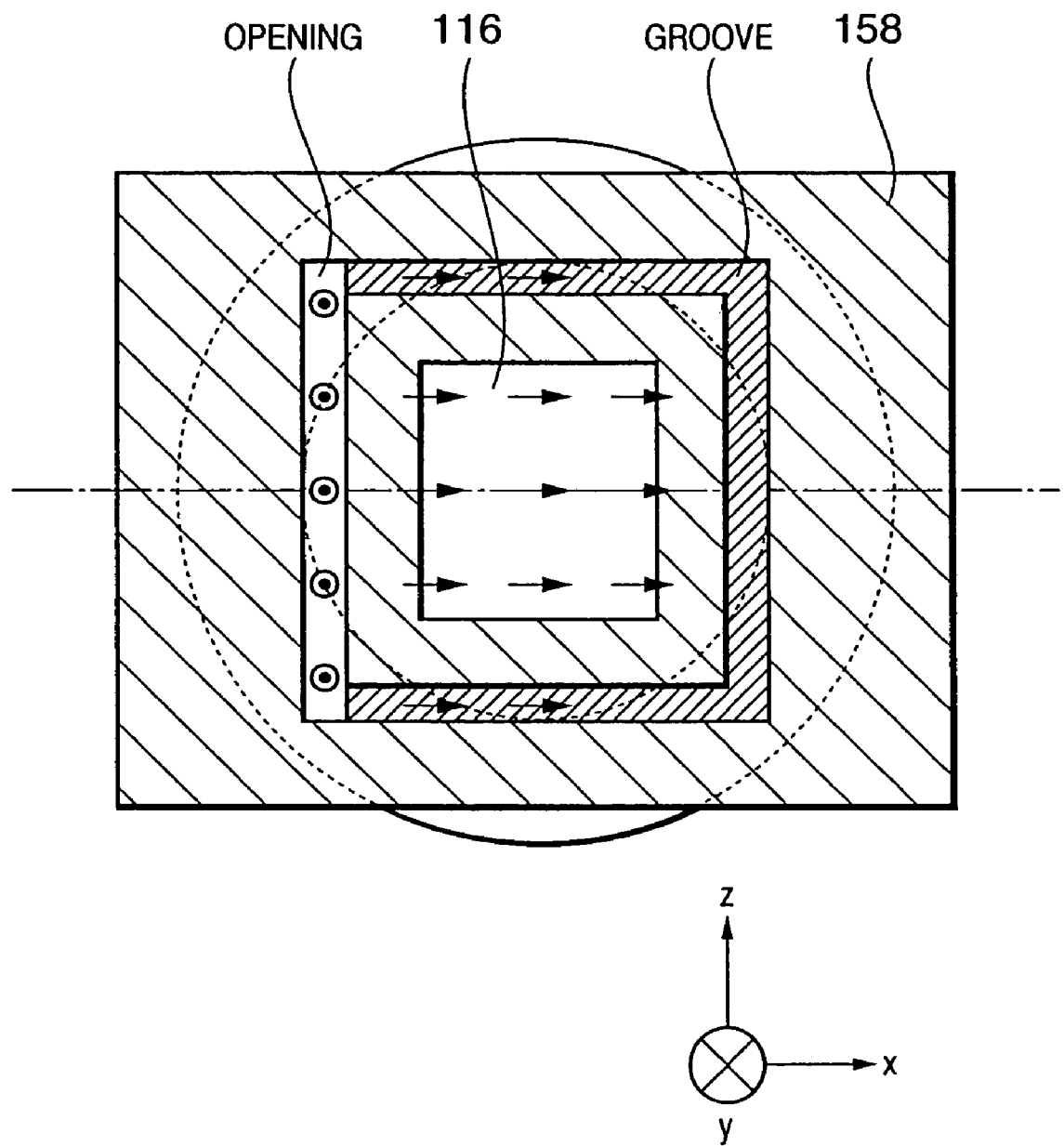
FIG. 21 is a view of the exposure apparatus of the fifth embodiment shown in FIG. 20, which is viewed from the lower side at the position of the opening plate.
Figure 22:
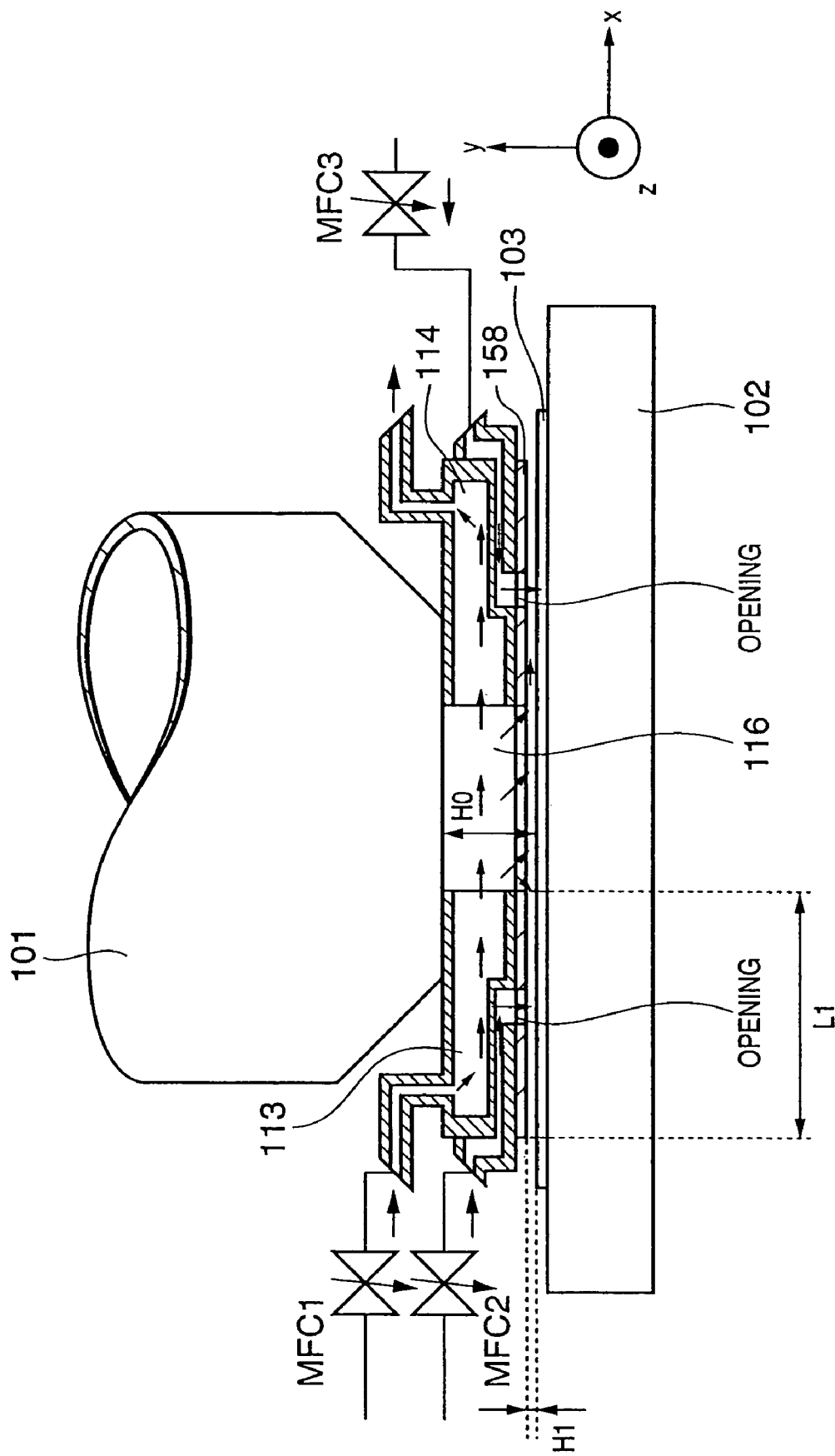
FIG. 22 is a view showing part of still another exposure apparatus according to the fifth embodiment of the present invention.

FIGS. 20 and 21 show still another modification. In this modification, a groove that surrounds the optical path space 116 is formed in the opening plate 157 of the embodiment shown in FIG. 15 or 16. When the distance from the opening plate 157 to the surface of the wafer 103 is as short as 2 mm or less, the groove is filled with the inert gas. Hence, the inert gas concentration around the optical path space 116 can be stabilized at a high concentration. Alternatively, as shown in FIG. 22, when an opening from which the inert gas is injected may be added to the lower portion of the exhaust port 114 in the embodiment shown in FIG. 17. In this case, even when the ambient atmosphere is involved from the exhaust port side, the decrease in inert gas concentration can be suppressed. Referring to FIG. 22, the supply amounts can be different mass flow controllers MFC1, MFC2, and MFC3. Hence, the flow rates can be optimized in accordance with the arrangement.

Figure 23:
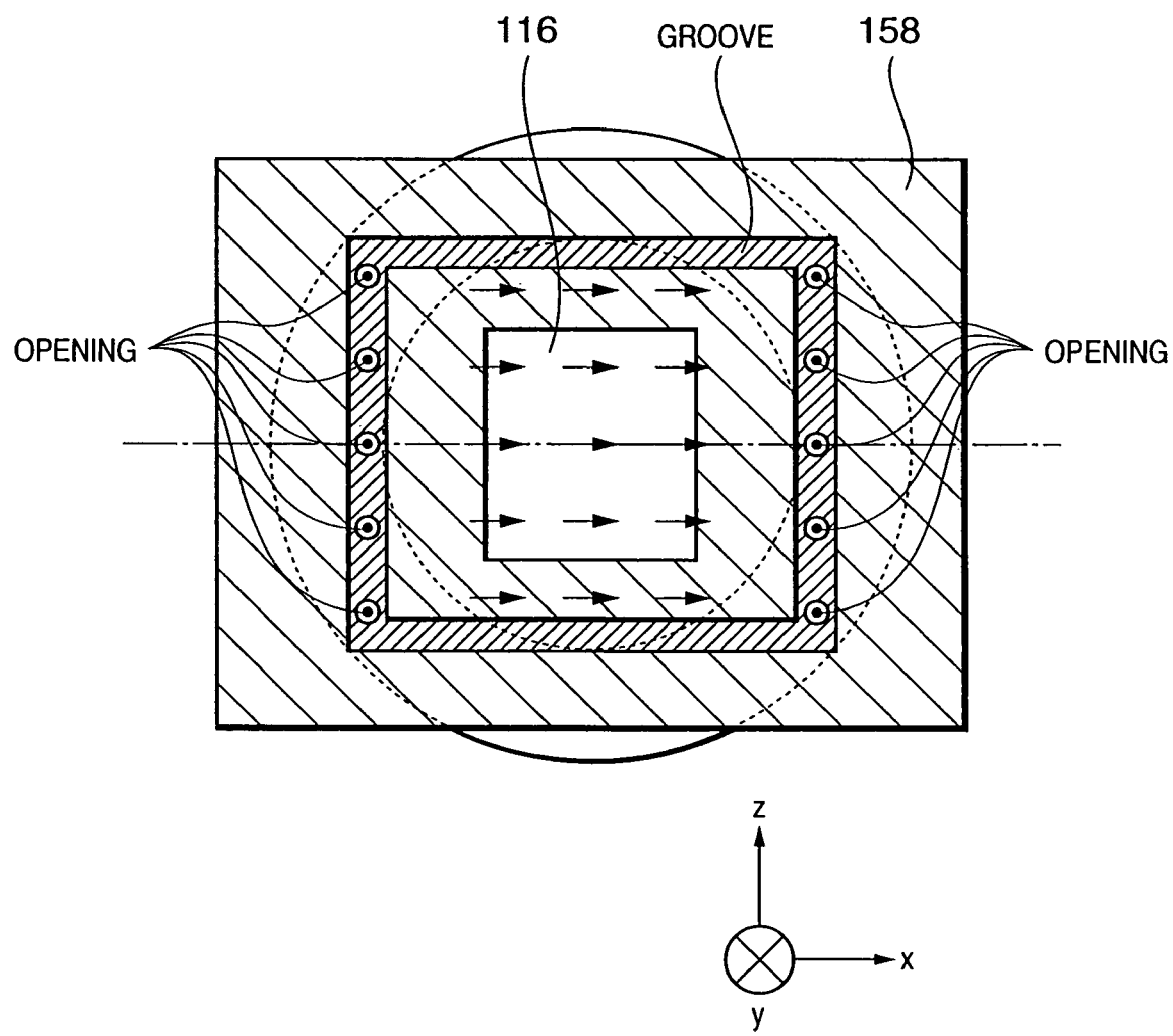
FIG. 23 is a view showing part of still another exposure apparatus according to the fifth embodiment of the present invention.

As shown in FIG. 23, a groove that surrounds the optical path space 116 may be formed in the opening plate 157, and a plurality of openings (10 openings in FIG. 23) may be formed in the groove to inject the inert gas from the opening plate 157 to the wafer surface side. Alternatively, as shown in FIG. 24, grooves that partially surround the optical path space 116 may be formed, and a plurality of openings (10 openings in FIG. 24) may be formed in the groove to inject the inert gas from the opening plate 157 to the wafer surface side.

Figure 24:
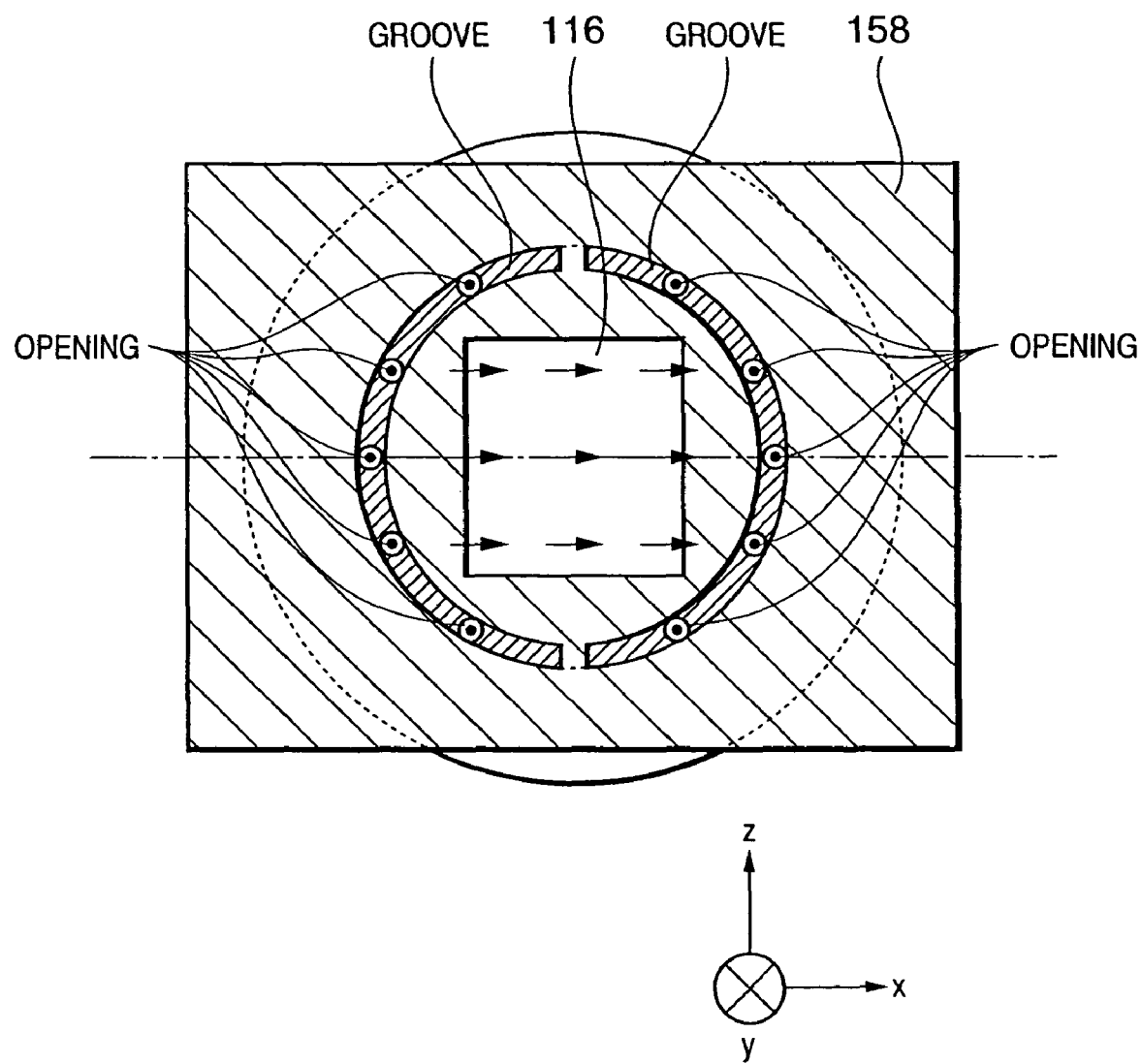
FIG. 24 is a view showing part of still another exposure apparatus according to the fifth embodiment of the present invention.

In FIGS. 23 and 24 as well, the inert gas may be commonly supplied to the optical path space 116 and predetermined space 150, as shown in FIG. 15. Alternatively, as shown in FIG. 22, supply of the inert gas to the optical path space 116 and supply of the inert gas to the predetermined space 150 may be separated. When the supply amounts are controlled by the separate mass flow controllers MFC1, MFC2, and MFC3, the concentration of the inert gas supplied from the supply port 113 can be stabilized at a high concentration.

The above embodiments assume that the supply amount of the inert gas to the optical path space 116 is set to be equal to or more than the exhaust amount. If the optical path space is not set to a positive pressure, the optical path space draws the ambient atmosphere. Hence, the inert gas concentration in the optical path space decreases, and the exposure light transmittance decreases. However, in the arrangements shown in FIGS. 23 and 24, inert gas supply to the optical path space 116 is separated from inert gas supply to the predetermined space 150, and the supply amounts are controlled by the separate mass flow controllers MFC1, MFC2, and MFC3. In this case, even when the pressure in the optical path space 116 is lower than that in the predetermined space 150, the inert gas concentration in the optical path space can be stabilized at a high concentration by setting the inert gas supply amount to the predetermined space 150 to be larger. For this reason, the exhaust amount can be increased, and contamination generated from the wafer surface at the time of exposure can be efficiently exhausted.

The opening plate 157 need not be independently prepared. Instead, an opening portion may be formed in the supply means or exhaust means.

The distance between the opening plate 157 (lower surface (wafer-side surface) of the supply means or exhaust means) and the wafer is set to one-half or less, or more preferably, one-third or less of the width corresponding to the distance between the outer periphery of the optical path space 116 and that of the opening plate 157 in a predetermined direction substantially parallel to the wafer. In this case, since the gas hardly flows in the predetermined space, the gas, such as oxygen, that absorbs exposure light is involved in the optical path space 116 at a low probability.

In addition, the height of the predetermined space 150 (the distance between the wafer and the lower surface of the opening plate 157) is preferably less than the distance between the wafer and the optical element of a projecting optical system 101, which is closest to the wafer. Preferably, the height of the predetermined space 150 is one-half or less, and more preferably, one-quarter or less the distance between the wafer and the optical element of the projecting optical system 101, which is closest to the wafer. Accordingly, the place where the inert gas concentration becomes low can be separated from the optical path space 116, so the inert gas concentration around the optical path space 116 can be stabilized at a high concentration.

The predetermined space 150 may be formed in the optical path space 116 only on the upstream side of the gas stream in the optical path space 116 (on the supply port side in the optical path space 116). The predetermined space 150 may be formed on both the upstream and downstream sides of the gas stream in the optical path space 116. The predetermined space 150 may be formed around the optical path space 116.

In the above first to fifth embodiments, an exposure apparatus is arranged to satisfy the first to third conditions, so that the effects of each of the first to fifth embodiments will be more remarkable.

Sixth Embodiment

Figure 25:
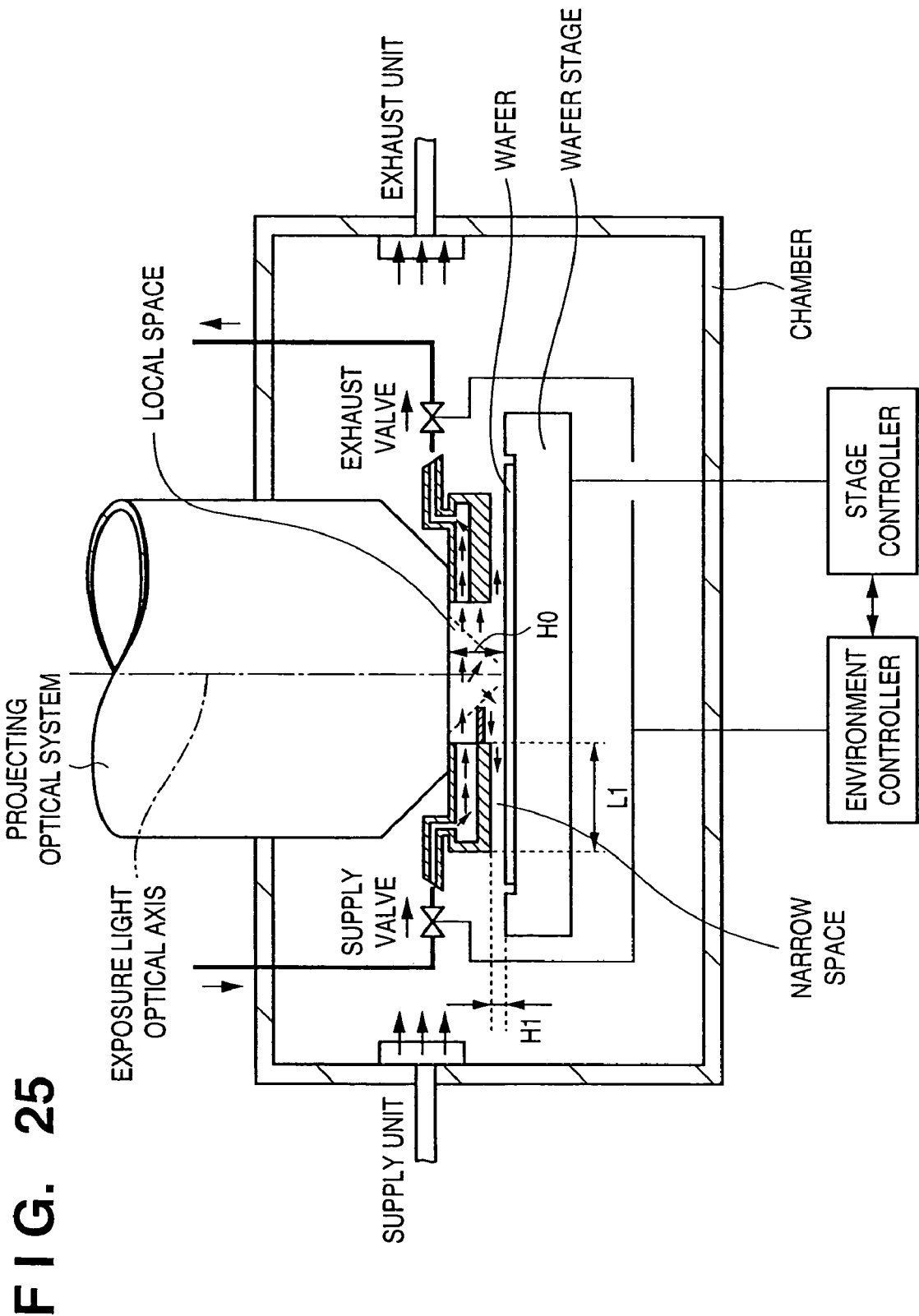
FIG. 25 is a view showing part of an exposure apparatus according to the sixth embodiment of the present invention.
Figure 26:
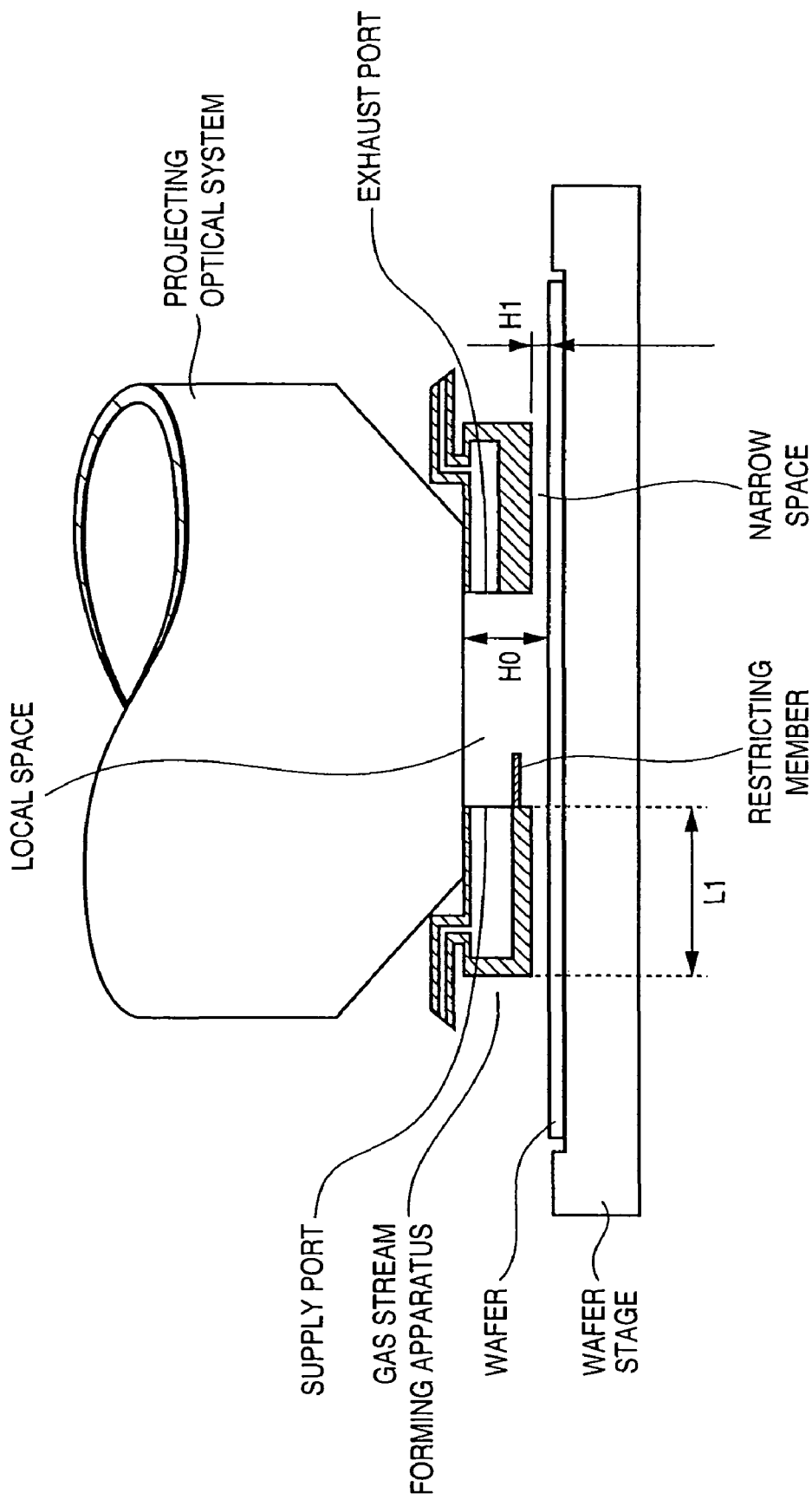
FIG. 26 is a view showing the sixth embodiment of the present invention from which the arrangement shown in FIG. 1 is omitted.

FIGS. 25 and 26 are views showing part of an exposure apparatus according to the sixth embodiment of the present invention. This exposure apparatus has a light source such as an $F_2$ excimer laser (not shown) which generates a short-wavelength laser beam as illumination light. The illumination light (exposure light) from the light source uniformly illuminates a reticle (mask) through an appropriate illumination optical member. The light (exposure light) transmitted through the reticle reaches, through various optical members of a projecting optical system, the surface of a wafer placed on a wafer stage installed in a chamber having a supply unit and an exhaust unit, and forms a reticle pattern on the wafer surface.

The wafer stage having the wafer placed thereon is designed to be movable in three-dimensional directions (X, Y, and Z directions). The reticle pattern is sequentially projected and transferred onto the wafer by a so-called step-and-repeat scheme that repeats stepping movement and exposure. Even when the present invention is applied to a scanning exposure apparatus, the arrangement is almost the same as described above.

For exposure, an inert gas (e.g., nitrogen gas, helium gas, or the like), whose temperature and impurity concentration are accurately managed, is supplied from a supply port through a supply valve to a local space, including the space through which the exposure light passes in the gas stream forming apparatus on the lower side of the projecting optical system and the periphery of the space. The inert gas supplied to the local space is partially recovered from an exhaust port and exhausted through an exhaust valve. Arrows in FIG. 25 indicate the flow of the inert gas.

Basically, the local space is set at a positive pressure with respect to the ambient atmosphere (the pressure in the local space is made higher than that in the ambient atmosphere), thereby decreasing the oxygen concentration in the exposure atmosphere in the local space. For this reason, the amount of inert gas that leaks from the local space to the peripheral space is more than the exhaust amount through the exhaust valve. The inert gas that has leaked from the local space is recovered and exhausted by an exhaust unit together with the chamber atmosphere supplied from a supply unit. The temperature and impurity concentration of the chamber atmosphere in the local space containing the exposure atmosphere are accurately managed by the gas stream forming apparatus. Hence, the gas supplied from the supply unit can be a gas whose temperature and impurity concentration are managed moderately as much as possible.

Opening/closing and the degrees of valve opening of the supply valve and exhaust valve are controlled by an environment controller. Since the supply valve and exhaust valve are normally open, the inert gas is always supplied into the local space independently of the position of the stage. However, when the stage is detached from the lower side of the local space to do wafer exchange or maintenance, control may be performed to temporarily stop inert gas supply or reduce the supply amount. Supply may be started or the supply amount may be increased after wafer exchange before the stage moves to the lower side of the local space again.

The environment controller, a stage controller, and other controllers (not shown) are systematically controlled by a main controller in various kinds of operations including wafer exchange, alignment operation, and exposure operation. The control contents by the main controller and the operation state of the exposure apparatus are monitored by a monitoring device.

If the atmosphere in the gap around the wafer 103 or at the step portion on the wafer stage in the region that enters or leaves the local space is insufficiently replaced, the ambient atmosphere may be involved in the optical path space when the wafer stage moves. This may increase the oxygen concentration in the local space.

In the sixth embodiment, to maintain the oxygen concentration in the local space to the set value or less, the gas stream forming apparatus is installed on the projecting optical system side while separated from the wafer by a narrow space. A distance H1 of the narrow space between the gas stream forming apparatus and the wafer is preferably equal to or less than ½, or more preferably, ⅕ of a distance H0 of the local space between the projecting optical system and the wafer. Accordingly, the oxygen concentration in the local space can be maintained to the set value or less. A length L1 of the narrow space along the gas stream is preferably set to twice or more, and preferably three times more, of the distance H1.

For the outer shape of the gas stream forming apparatus, the section of the gas stream forming apparatus shown in FIG. 25 may be extended in the depth direction of the purge surface. The gas stream forming apparatus may alternatively have a rotationally symmetrical shape with respect to the exposure optical axis. The outer shape is not particularly limited to the above shapes.

In the local space, for example, an inorganic gas may be generated from the resist applied to the wafer. The organic gas may react with exposure light and contaminate the surface of the lens of the projecting optical system. This may fog the lens and decrease the exposure light intensity.

To prevent this, in the sixth embodiment, a restricting member, which partially reduces the sectional area of the local space in a direction from the projecting optical system to the wafer, is arranged at the outlet of the supply port in the local space. The narrow space suppresses any vortex flow generated when the gas in the local space moves from the wafer side to the projecting optical system side along an axis corresponding to the vertical direction of the page surface. Hence, the organic gas or the like generated from the resist applied to the wafer is quickly exhausted. Since the concentration of the organic gas reaching the lens of the projecting optical system can be sufficiently reduced, fogging on the lens can be suppressed. In addition, since the inert gas in the local space smoothly flows, the oxygen concentration in the local space can be more quickly reduced.

The installation position of the restricting member is not limited to the supply side of the local space, as shown in FIG. 26. The restricting member may be arranged on the exhaust side, as shown in FIG. 27, or on both the supply and exhaust sides, as shown in FIG. 28.

Figure 27:
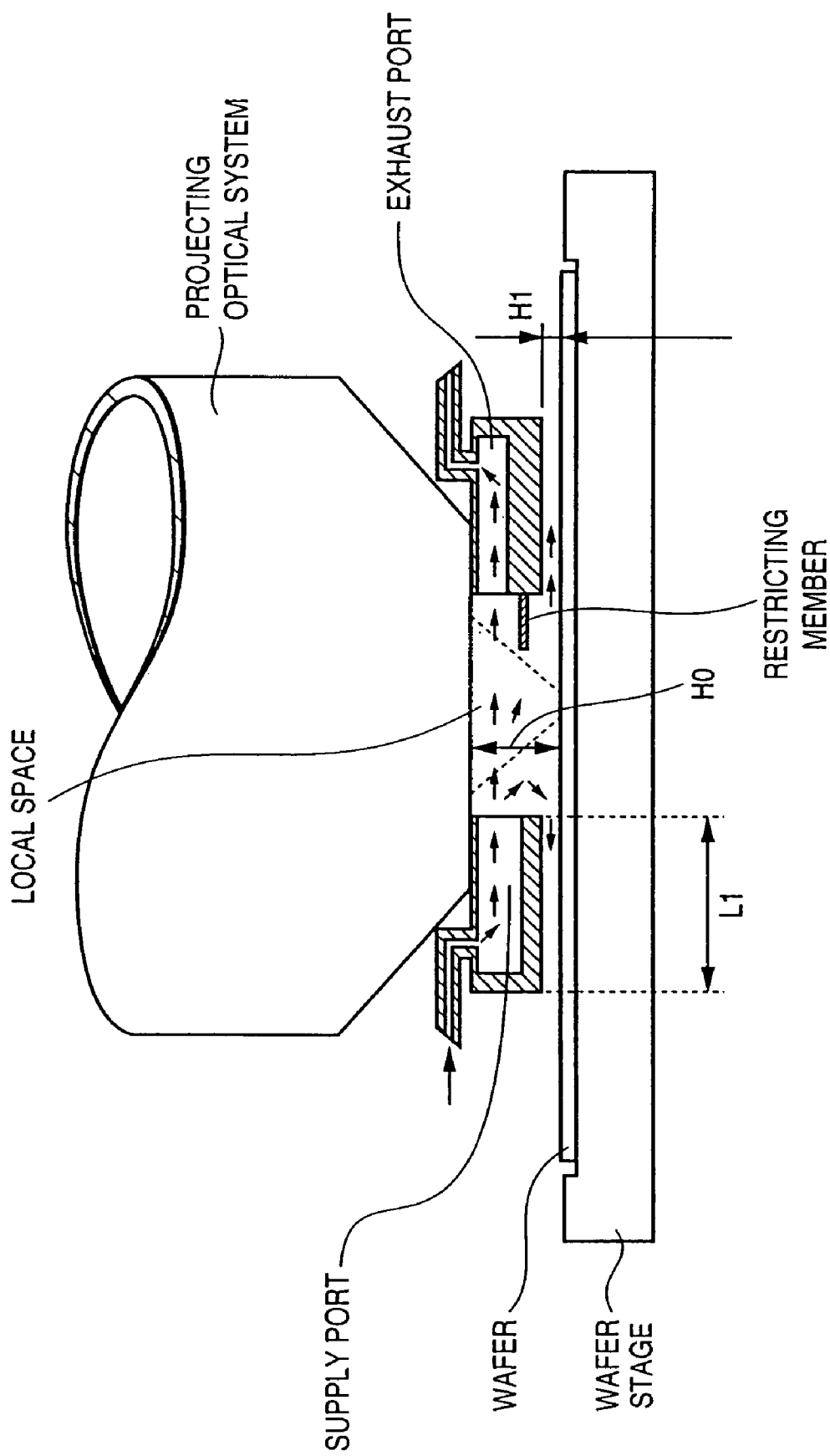
FIG. 27 is a view showing a modification of the exposure apparatus shown in FIG. 2 according to the sixth embodiment of the present invention.
Figure 28:
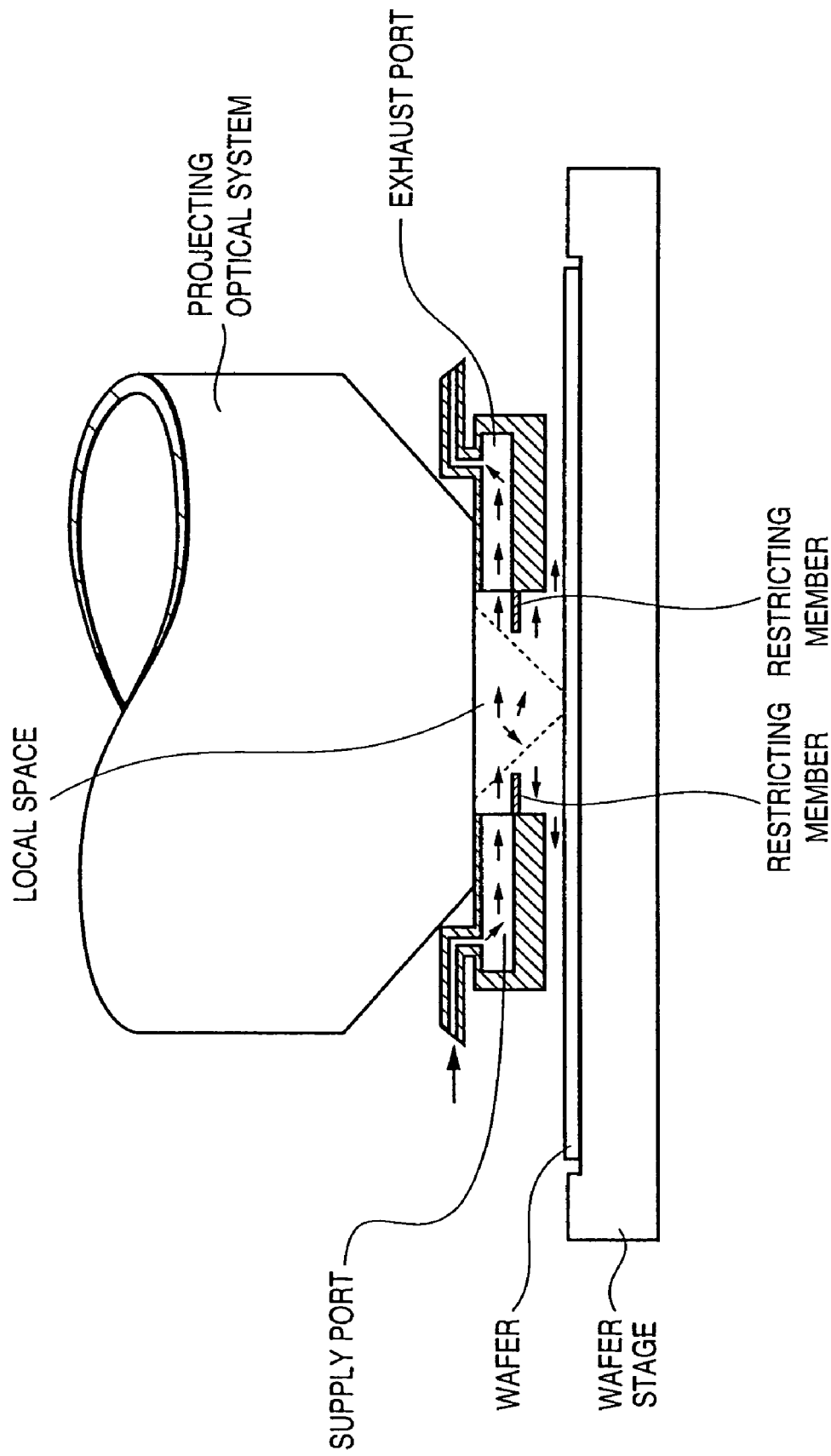
FIG. 28 is a view showing another modification of the exposure apparatus shown in FIG. 2 according to the sixth embodiment of the present invention.
Figure 29:
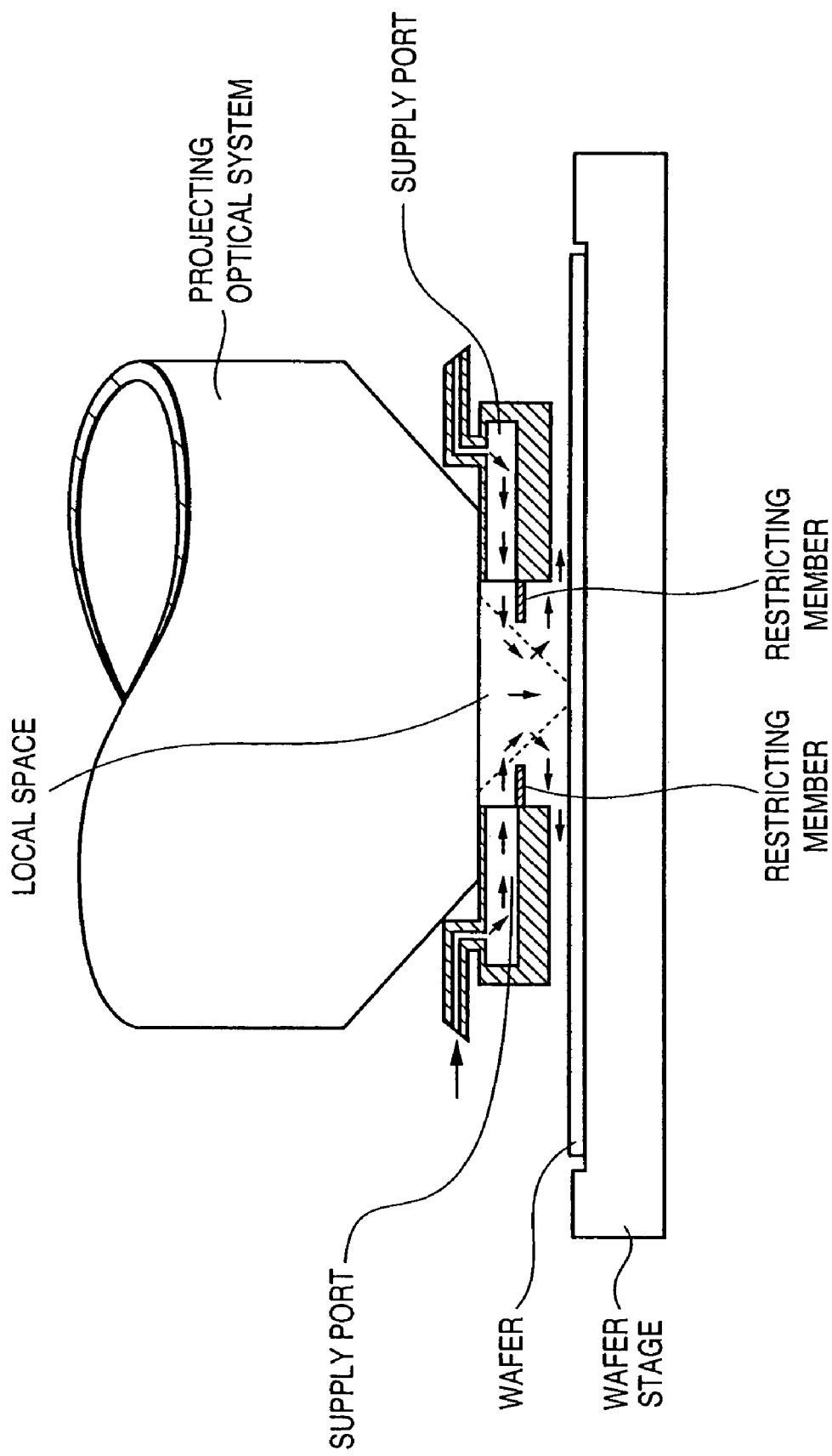
FIG. 29 is a view showing still another modification of the exposure apparatus shown in FIG. 2 according to the sixth embodiment of the present invention.
Figure 30:
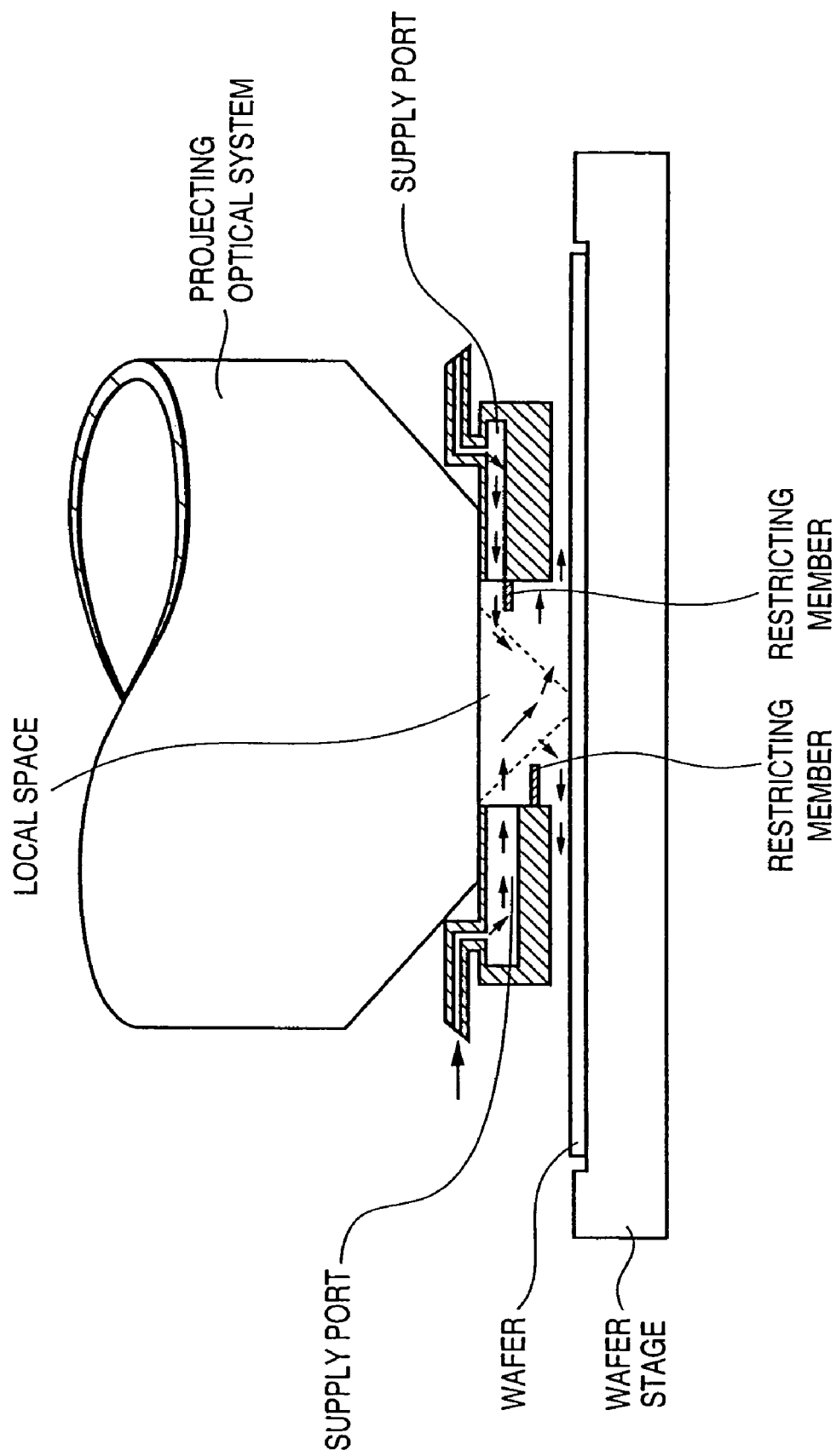
FIG. 30 is a view showing still another modification of the exposure apparatus shown in FIG. 2 according to the sixth embodiment of the present invention.

As a modification, the exhaust mechanism in FIG. 27 may be changed to a supply mechanism having opposing supply ports in the local space, and a restricting member may be arranged at each supply port, as shown in FIG. 29. In this case, the inert gas supply amounts from the supply ports, and the lengths and positions of the restricting members need not always be symmetrical. An asymmetrical arrangement (the restricting members have different heights in the optical axis direction of the projecting optical system) shown in FIG. 30 can more effectively prevent contamination.

As another modification, instead of arranging a restricting member, a notch portion removing the wafer-side part of the gas stream forming apparatus near the supply port is installed to partially widen the narrow space, as shown in FIG. 31. With this arrangement, the same effect as that obtained by arranging the restricting member can be expected.

In this embodiment, the restricting member is fixed. However, a driving mechanism for moving the restricting member may be added to move the restricting member in accordance with the exposure state. In this case, for example, when the stage should be moved without performing exposure, the projecting amount of the restricting member can be increased to prevent any decrease in inert gas concentration. During exposure, the restricting member can be retracted so as not to shield the exposure light.

In this embodiment, the projecting optical system, wafer, and the wafer stage have been described in detail. The present invention can also be applied to the illumination optical system, reticle, and reticle stage, as shown in FIG. 33.

Seventh Embodiment

In the seventh embodiment, two supply/exhaust systems are prepared in the gas stream forming apparatus, as shown in FIG. 32. Two supply ports oppose each other on the projecting optical system side. A supply port and an exhaust port oppose each other on the wafer side. A restricting member is arranged between the two pairs of supply ports/exhaust ports.

According to this arrangement, the two opposing supply ports and exhaust ports on the projecting optical system side suppress an impurity gas which is generated from the resist applied to the wafer and reaches the projecting optical system. Hence, the impurity gas can be quickly exhausted by the gas stream formed by the supply port and exhaust port on the wafer side.

Each of the supply/exhaust system on the projecting optical system side and that on the wafer side may have both the supply port and exhaust port.

In the above sixth and seventh embodiments, an exposure apparatus is arranged to satisfy the first to third conditions, so that the effects of each of the first to fifth embodiments will be more remarkable.

[Application Example of Exposure Apparatus]

A semiconductor device manufacturing process using the above exposure apparatus will be described next.

FIG. 11 shows the flow of the overall manufacturing process of a semiconductor device.

In step 1 (circuit design), the circuit of a semiconductor device is designed. In step 2 (mask preparation), a mask is prepared on the basis of the designed circuit pattern. In step 3 (wafer manufacture), a wafer is manufactured using a material such as silicon. In step 4 (wafer process), called a preprocess, an actual circuit is formed on the wafer by lithography using the mask and wafer.

In step 5 (assembly), called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and shipped in step 7.

Figure 13:
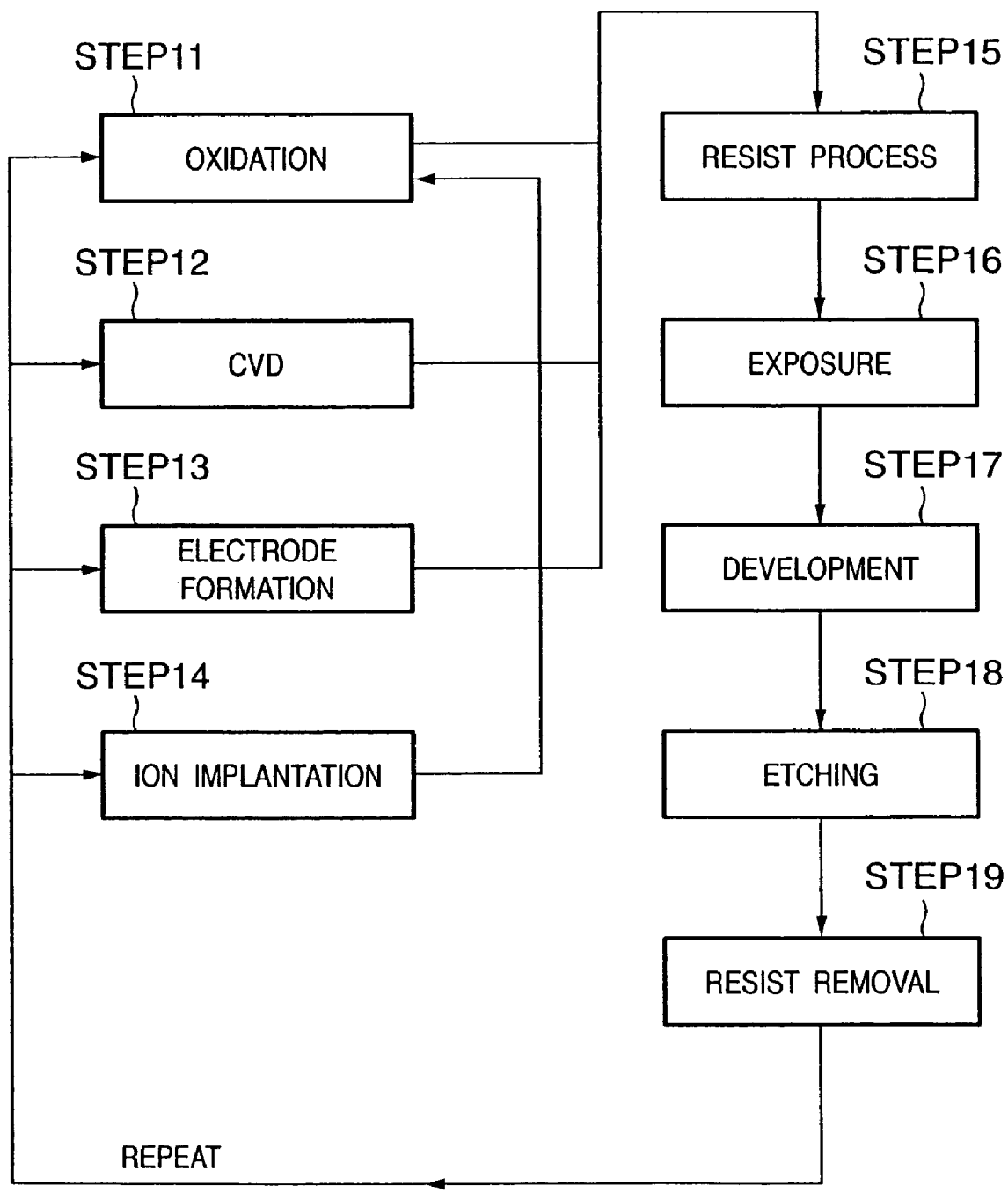
FIG. 13 is a flow chart of the overall manufacturing process of a semiconductor device.
Figure 14A:
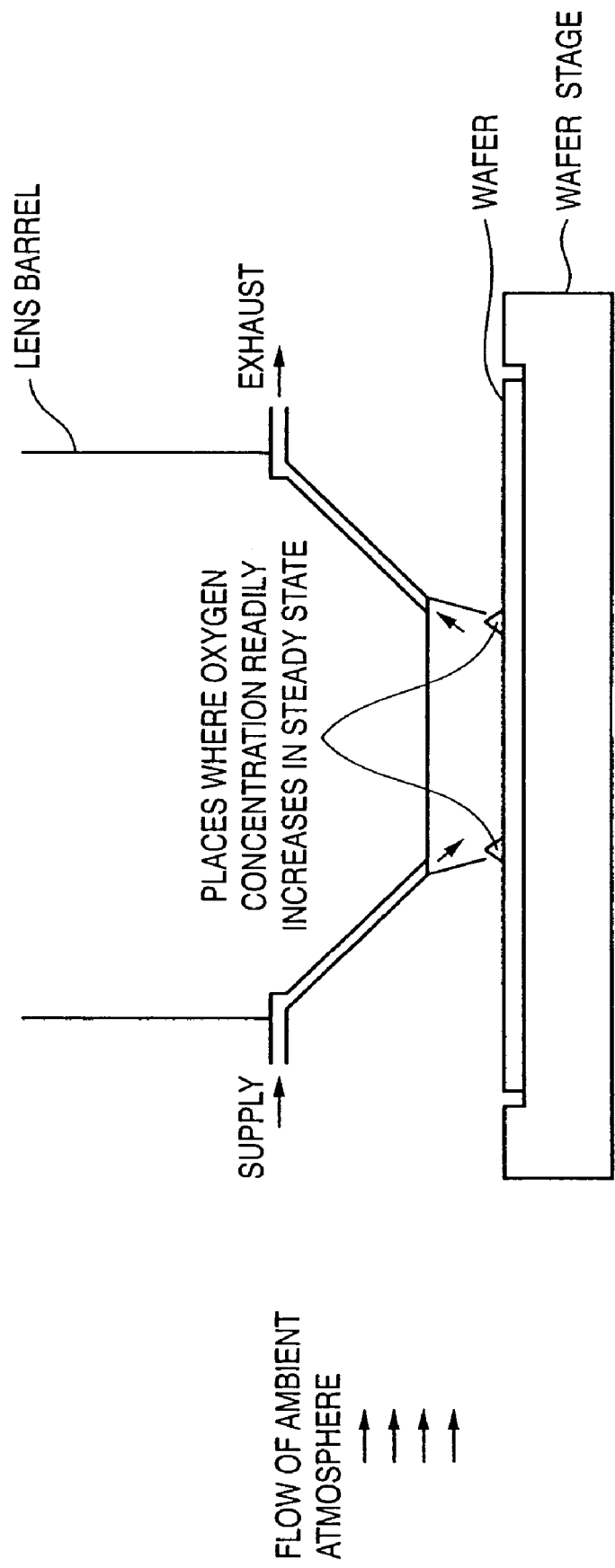
FIG. 14A is a view showing part of a conventional exposure apparatus.
Figure 14B:
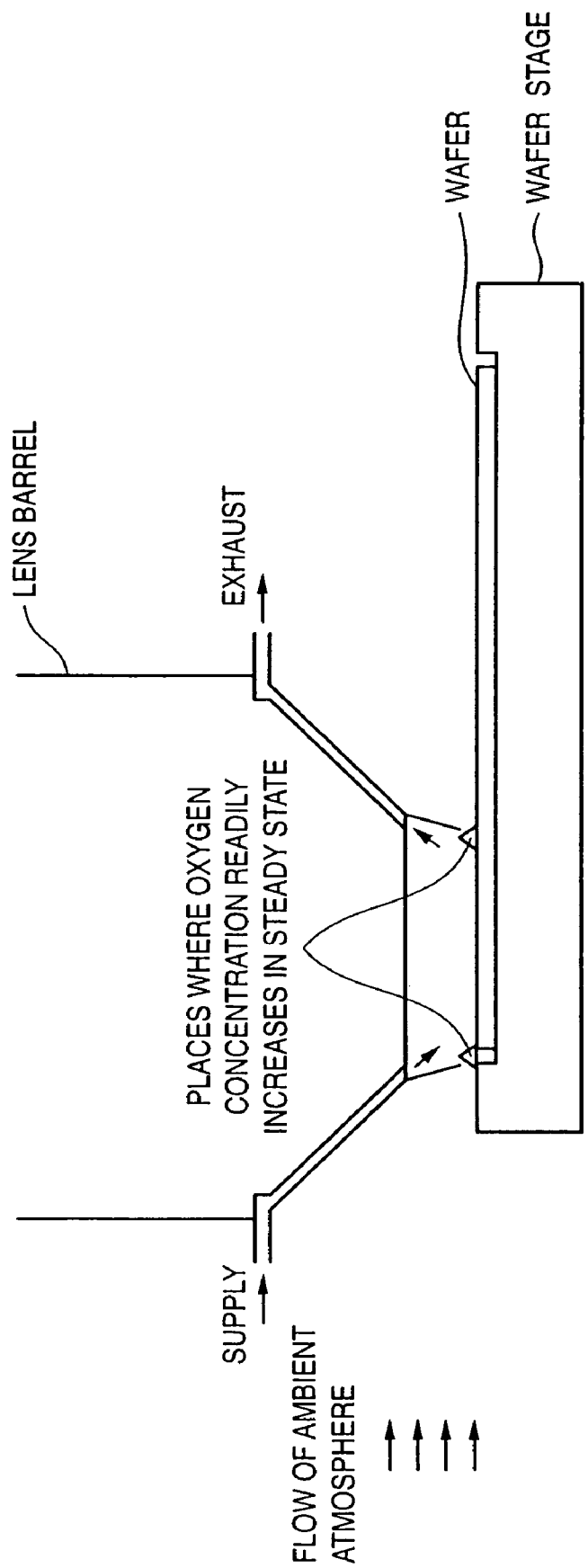
FIG. 14B is a view showing part of the conventional exposure apparatus.

FIG. 13 shows details of the wafer process.

In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern is transferred to the wafer using the above exposure apparatus. In step 17 (development), the exposed wafer is developed. In step 18 (etching), portions other than the developed resist image are etched. In step 19 (resist removal), any unnecessary resist remaining after etching is removed. By repeating these steps, a multi-layered structure of circuit patterns is formed on the wafer.

As many apparently widely different embodiments of the present invention can be made without departing from the spirit and scope thereof, it is to be understood that the invention is not limited to the specific embodiments thereof, except as defined in the appended claims.

What is claimed is:

1. An exposure apparatus for exposing a substrate to exposure light via a pattern of a mask, said apparatus comprising:
    a stage configured to hold one of the substrate and the mask, and to be moved;
    a projection optical system configured to project the pattern onto the substrate;
    a defining member facing said stage and configured to define a first space, between said stage and said projection optical system, through which the exposure light passes and which is to be filled with fluid;
    a first stream mechanism having a first supply port in said defining member and configured to stream fluid through the first space from said first supply port, the first supply port opening into the first space;
    an exhaust mechanism having an exhaust port in said defining member and configured to exhaust fluid in the first space from said exhaust port, the exhaust port opening into the first space; and
    a second stream mechanism having a second supply port, different from said first supply port, wherein said second supply port is arranged to surround the first space at a lower portion of said defining member, and is configured to stream fluid from said second supply port against a portion of said stage that opposes the second supply port, so as to seal the first space through which said first stream mechanism streams the fluid,
    wherein said second supply port is arranged lower than each of said first supply port and said exhaust port, and
    wherein said apparatus is configured such that (i) a pressure in the first space is not positive relative to a pressure in a third space that is separated from the first space by a second space located between said second supply port and the portion of said stage, and (ii) a pressure in the second space is higher than the pressure in the first space and the pressure in the third space.

2. An apparatus according to claim 1, wherein said first stream mechanism and said second stream mechanism are configured to stream the same kind of fluid.

3. An apparatus according to claim 2, wherein said second stream mechanism is configured to stream gas.

4. A method of manufacturing a device, said method comprising steps of:
    exposing a substrate to exposure light via a pattern of a mask using an exposure apparatus as defined in claim 1;
    developing the exposed substrate; and
    processing the developed substrate to manufacture the device.

5. An apparatus according to claim 2, wherein said second stream mechanism is configured to stream inert gas.

* * * * *